(12) United States Patent
Toyota et al.

(10) Patent No.: US 7,550,772 B2
(45) Date of Patent: Jun. 23, 2009

(54) IMAGE DISPLAY DEVICE AND MANUFACTURING METHOD THEREOF

(75) Inventors: Yoshiaki Toyota, Hachioji (JP); Takeshi Sato, Kokubunji (JP); Mieko Matsumura, Kokubunji (JP)

(73) Assignee: Hitachi, Displays, Ltd., Mobara-shi (JP)

( * ) Notice: Subject to any disclaimer, the term of this patent is extended or adjusted under 35 U.S.C. 154(b) by 242 days.

(21) Appl. No.: 11/741,272

(22) Filed: Apr. 27, 2007

(65) Prior Publication Data
US 2007/0252145 A1 Nov. 1, 2007

(30) Foreign Application Priority Data
Apr. 28, 2006 (JP) .............................. 2006-125338

(51) Int. Cl.
*H01L 29/04* (2006.01)
*H01L 31/036* (2006.01)
(52) U.S. Cl. .................. 257/72; 257/347; 257/E29.117
(58) Field of Classification Search .................. 257/59, 257/72, 347, E27.112, E29.117, E29.287
See application file for complete search history.

(56) References Cited

U.S. PATENT DOCUMENTS 7,420,211 B2 * 9/2008 Ohtani et al. .................. 257/72

OTHER PUBLICATIONS

N. Ibaraki, Low-Temperature Poly-Si TFT Technology; SID 1999 Digest; Toshiba LCD R&D Center, Saitama, Japan; pp. 172-175.

* cited by examiner

*Primary Examiner*—Hoai v Pham
(74) *Attorney, Agent, or Firm*—Antonelli, Terry, Stout & Kraus, LLP.

(57) ABSTRACT

An image display device of reduced cost is provided. A plurality of gate lines, a plurality of signal lines formed to cross the gate lines in a matrix fashion, and a plurality of thin-film transistors are formed on an insulating substrate, and the plurality of gate lines are laminated electrodes. The plurality of thin-film transistors are configured of transistors of two types of an n-channel conductivity type and a p-channel conductivity type. Gate electrodes of thin-film transistors of one type are laminated electrodes of the same configuration as the gate lines, and gate electrodes of thin-film transistors of the other type are configured of electrodes of the same layer as bottom electrodes of the gate lines.

12 Claims, 23 Drawing Sheets

PHOTO PROCESS 1

A--------A'     B--------B'     C--------C'
p-CHANNEL TFT   n-CHANNEL TFT   PIXEL ELECTRODE

PHOTO PROCESS 2

A--------A'     B--------B'     C--------C'
p-CHANNEL TFT   n-CHANNEL TFT   PIXEL ELECTRODE

PHOTO PROCESS 3

A--------A'     B--------B'     C--------C'
p-CHANNEL TFT   n-CHANNEL TFT   PIXEL ELECTRODE

PHOTO PROCESS 1

PHOTO PROCESS 2

D----------D'  G----------------------------------G'
p-CHANNEL TFT    n-CHANNEL TFT      PIXEL ELECTRODE

PHOTO PROCESS 1

H--------H'  J--------J'  K--------K'
p-CHANNEL TFT   n-CHANNEL TFT   PIXEL ELECTRODE

PHOTO PROCESS 2

H--------H'  J--------J'  K--------K'
p-CHANNEL TFT   n-CHANNEL TFT   PIXEL ELECTRODE

PHOTO PROCESS 3

H--------H'  J--------J'  K--------K'
p-CHANNEL TFT   n-CHANNEL TFT   PIXEL ELECTRODE p-CHANNEL TFT    n-CHANNEL TFT    PIXEL ELECTRODE p-CHANNEL TFT    n-CHANNEL TFT    PIXEL ELECTRODE p-CHANNEL TFT | n-CHANNEL TFT | PIXEL ELECTRODE p-CHANNEL TFT | n-CHANNEL TFT | PIXEL ELECTRODE p-CHANNEL TFT | n-CHANNEL TFT | PIXEL ELECTRODE

IMAGE DISPLAY DEVICE AND MANUFACTURING METHOD THEREOF

BACKGROUND OF THE INVENTION

1. Field of the Invention

The present invention relates to an image display device, and more particularly to a low-cost image display device and a manufacturing method thereof.

2. Description of the Related Art

An excellent feature of polycrystalline silicon thin-film transistors (denoted by TFT) is that the mobility therein is by two or more orders of magnitude higher than that in amorphous silicon TFT. For example, an active-matrix liquid crystal display device described in Society for Information Displays, International Symposium, Digest of Technical Papers p. 172 (1999) is a device using such an advantage of polycrystalline silicon TFT. This image display device is a flat device called "flat panel display" (FPD). By configuring part of a peripheral driver circuit of the display device of polycrystalline silicon TFT, the number of contact terminals of pixel units and the peripheral driver circuit can be reduced and a high-resolution image display can be realized.

FIG. 2 shows circuit configuration of the conventional image display device. A plan view of a CMOS thin-film transistor (MOS) 2 configuring a peripheral driver circuit 1 of this image display device and a plan view of a pixel 3 are shown in FIG. 3 and FIG. 4, respectively. A method for manufacturing the conventional image display device will be described below with reference to FIGS. 5A to 5G by using the cross sections A-A', B-B', and C-C' shown in FIG. 3 and FIG. 4. The A-A' cross section is a portion of a p-channel TFT, the B-B' cross section is a portion of an n-channel TFT, and the C-C' cross section is a portion of a pixel electrode.

A silicon oxide film BUF is deposited to a thickness of 100 nm as a buffer layer on a glass substrate SUB that is an insulating substrate, and then an amorphous silicon layer is deposited to a thickness of 50 nm by plasma enhanced chemical vapor deposition. The amorphous silicon layer is then crystallized by irradiation with a XeCl excimer laser beam, and an island-like polycrystalline silicon layer PSI is obtained by a well-known photo photolithography-etching process (photo process 1) (FIG. 5A). A gate insulating film OX1 is then deposited to a thickness of 100 nm by plasma enhanced chemical vapor deposition and boron ions are implanted to adjust the threshold value of the n-channel TFT. A region of the n-channel TFT is then covered with a resist by a well-known photolithography process (photo process 2), and phosphorus ions are then implanted to adjust the threshold value of the p-channel TFT (FIG. 5B).

A metal film comprising, for example, tungsten (W) is then deposited and a gate electrode GM and a gate line GL are formed by a well-known photolithography process (photo process 3) (see FIG. 4). A lightly-doped n-type polycrystalline silicon layer LDN is then formed by ion implantation of phosphorus by using the gate electrode as a mask (FIG. 5C). Parts of the lightly-doped n-type polycrystalline silicon layer LDN and the gate electrode are covered with a resist by a well-known photolithography process (photo process 4) and a highly-doped n-type polycrystalline silicon layer HDN is formed by using the resist as a mask (FIG. 5D). A region of the n-channel TFT is then covered with a resist by a well-known photolithography process (photo process 5), and a highly-doped p-type polycrystalline silicon layer HDP is formed by using the resist as a mask (FIG. 5E).

An interlayer insulating film OX2 is then formed by plasma enhanced chemical vapor deposition so as to cover the entire surface, and a contact hole CNT1 is formed by a well-known photo photolithography-etching process (photo process 6). Then, a metal layer comprising, for example, aluminum (Al) is deposited and a source/drain electrode SDM and a signal line are formed by a well-known photo photolithography-etching process (photo process 7) (FIG. 5F).

A passivation film PAS1 comprising silicon nitride (SiN) and a passivation film PAS2 comprising an organic material are then formed so as to cover the entire surface, and a contact hole CNT2 is formed by a well-known photo photolithography-etching process (photo process 8). A pixel electrode PX comprising Indium Tin Oxide (ITO) is then formed by a well-known photo photolithography-etching process (photo process 9) (FIG. 5G).

SUMMARY OF THE INVENTION

In the conventional polycrystalline silicon TFT manufacturing process, an n-channel TFT and a p-channel TFT have to be produced separately on the same insulating substrate. As a result, the number of photolithography processes performed for ion implantation necessary to adjust the threshold value and form a highly-doped dopant region increases and throughput decreases.

It is an object of the present invention to provide an image display device that can be manufactured at a low cost and with increased throughput because the number of photolithography processes performed in the polycrystalline silicon TFT manufacturing process is reduced.

The image display device in accordance with the present invention has a plurality of gate lines, a plurality of signal lines formed to cross the plurality of gate lines in a matrix fashion, and a plurality of thin-film transistors on an insulating substrate in which at least the front surface has insulating property. The plurality of gate lines are laminated electrodes, and the plurality of thin-film transistors include transistors of two types of an n-channel conductivity type and a p-channel conductivity type. Gate electrodes of thin-film transistors of one type are laminated electrodes of the same material as the gate lines, and gate electrodes of thin-film transistors of the other type are monolayer electrodes of the same material as bottom electrodes of the gate lines.

Further, the image display device in accordance with the present invention has a plurality of gate lines, a plurality of signal lines formed to cross the plurality of gate lines in a matrix fashion, and a plurality of thin-film transistors on an insulating substrate in which at least the front surface has insulating property. The plurality of gate lines are laminated electrodes, pixel electrodes are provided in a region surrounded by the plurality of gate lines and the plurality of signal lines, the plurality of thin-film transistors include transistors of two types of an n-channel conductivity type and a p-channel conductivity type, gate electrodes of thin-film transistors of one type are of the same material as the pixel electrodes, and gate electrodes of thin-film transistors of the other type have a structure comprising a layer of the same material as the gate lines and a layer of the same material as the pixel electrodes.

These thin-film transistors are formed from polycrystalline silicon. The polycrystalline silicon TFT can be applied not only to liquid crystal display devices, but also to image display devices using OLED (Organic Light Emitting Diode) and other active matrix-type image display device or electronic paper.

In the image display device comprising CMOS, gate electrodes of thin-film transistors of one type are of the same material as the pixel electrodes, and gate electrodes of thin-film transistors of the other type have a laminated structure of a layer of the same material as the gate lines and a layer of the same material as the pixel electrodes.

DESCRIPTION OF THE PREFERRED EMBODIMENTS

Best modes for carrying out the present invention will be described below with reference to embodiments thereof. In the embodiments, an image display device will be explained in which a TFT active matrix circuit and a peripheral driver circuit are formed on the same insulating substrate.

Embodiment 1

Figure 1:
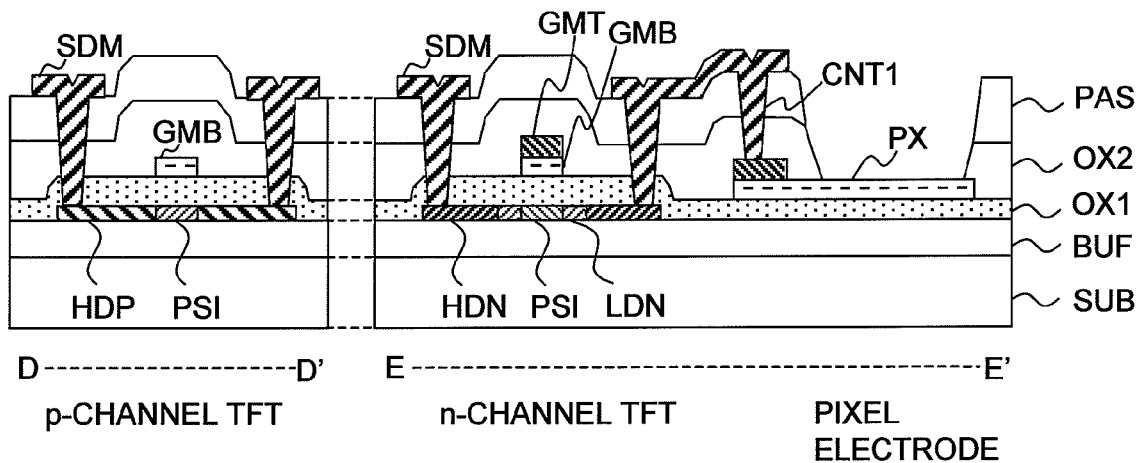
FIG. 1 is a cross-sectional view in the vicinity of a thin-film transistor constituting a pixel portion that serves to explain Embodiment 1 of the image display device in accordance with the present invention.
Figure 6:
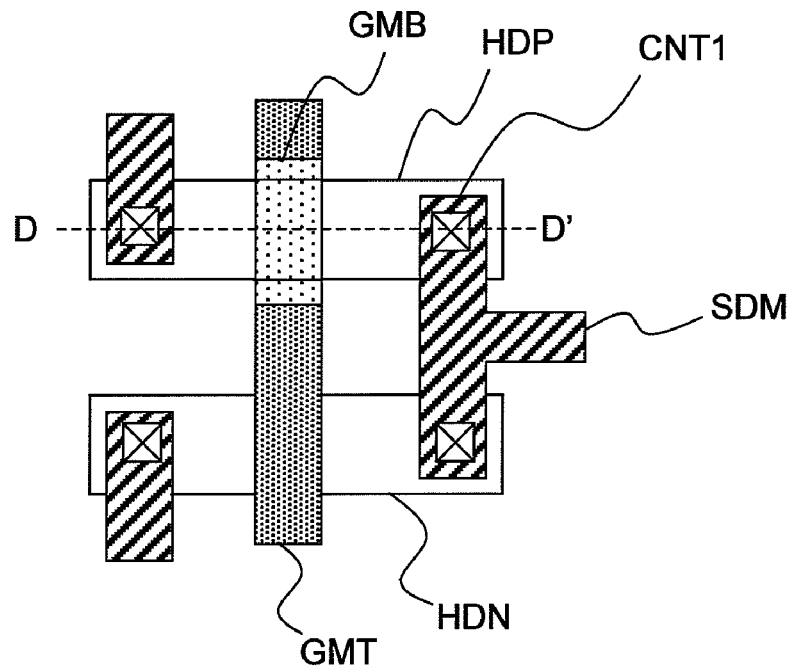
FIG. 6 is a planar layout view of a CMOS thin-film transistor illustrating Embodiment 1 of the image display device in accordance with the present invention.
Figure 7:
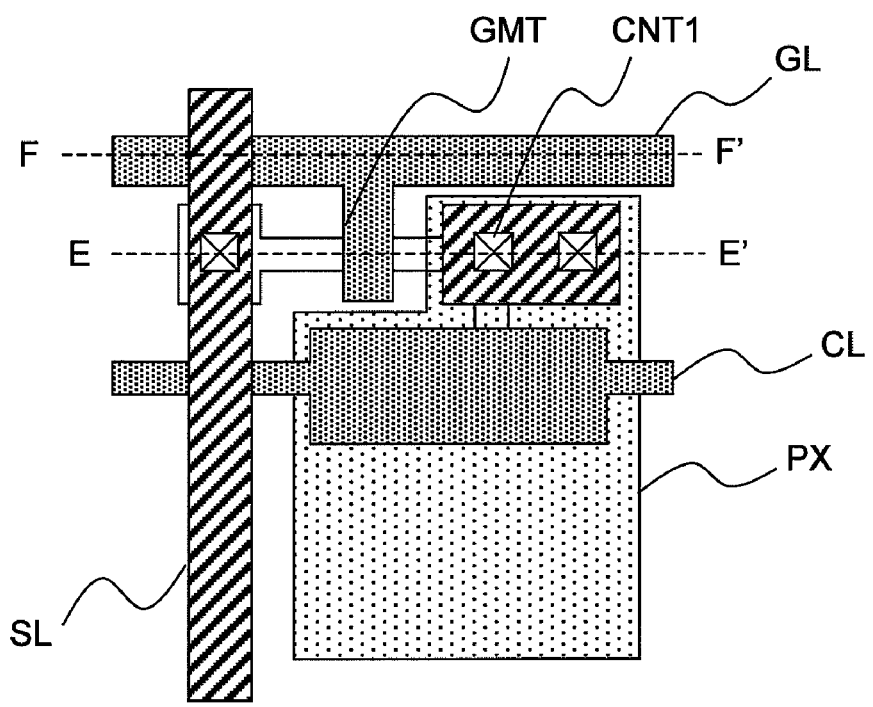
FIG. 7 is a planar layout view of pixels illustrating Embodiment 1 of the image display device in accordance with the present invention.

FIG. 1 is a cross-sectional view in the vicinity of a thin-film transistor constituting a pixel portion that serves to explain Embodiment 1 of the image display device in accordance with the present invention. A D-D' section is a portion of a p-channel TFT, and an E-E' section is a portion of an n-channel TFT and a pixel electrode. The circuit configuration of the image display deice of Embodiment 1 of the present invention is identical to that shown in FIG. 2. FIG. 6 and FIG. 7 show a plan view of a CMOS 2 constituting a peripheral driver circuit and a plan view of a pixel 3, respectively. A method for manufacturing these CMOS and pixel portion will be explained with FIGS. 8A to 8D and FIGS. 9A to 9F by using the D-D' section shown in FIG. 6 and the E-E' section shown in FIG. 7.

Figure 9A:
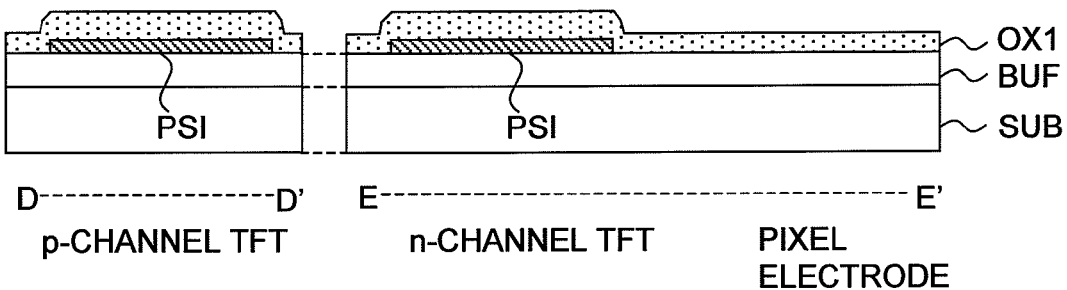
FIG. 9A is a cross-sectional view illustrating a process for manufacturing the image display device of Embodiment 1 of the present invention.

A silicon oxide film BUF is deposited to a thickness of 100 nm as a buffer layer on a glass substrate SUB, and then an amorphous silicon layer is deposited to a thickness of 50 nm by plasma enhanced chemical vapor deposition. The amorphous silicon layer is then crystallized by irradiation with a XeCl excimer laser beam, and an island-like polycrystalline silicon layer PSI is obtained by a well-known photo photolithography-etching process (photo process 1). A gate insulating film OX1 is then deposited to a thickness of 100 nm by plasma enhanced chemical vapor deposition and boron ions are implanted to adjust the threshold value of the n-channel TFT (FIG. 9A).

Figure 9B:
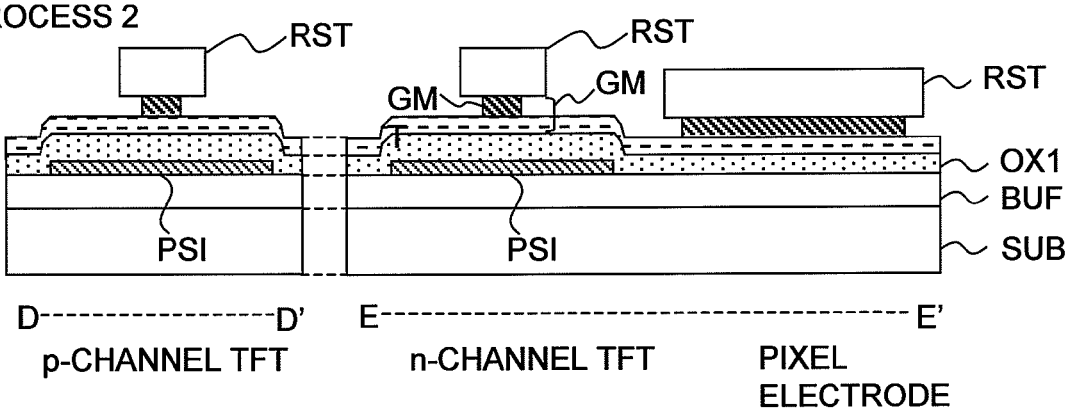
FIG. 9B is a cross-sectional view that is a continuation of the view shown in FIG. 9A and illustrates a process for manufacturing the image display device of Embodiment 1 of the present invention.

An ITO with a film thickness of 30 nm and a laminated metal film comprising tungsten and having a film thickness of 150 nm are then deposited. A resist mask is formed by patterning a gate electrode GM, a gate line GL, and a pixel electrode PX by a well-known photolithography process (photo process 2), side etching of a gate top electrode GMT (tungsten) is performed by well-known wet etching and the electrode is reduced in size by 0.5 to 1.0 μm with respect to the resist (FIG. 9B).

Figure 8A:
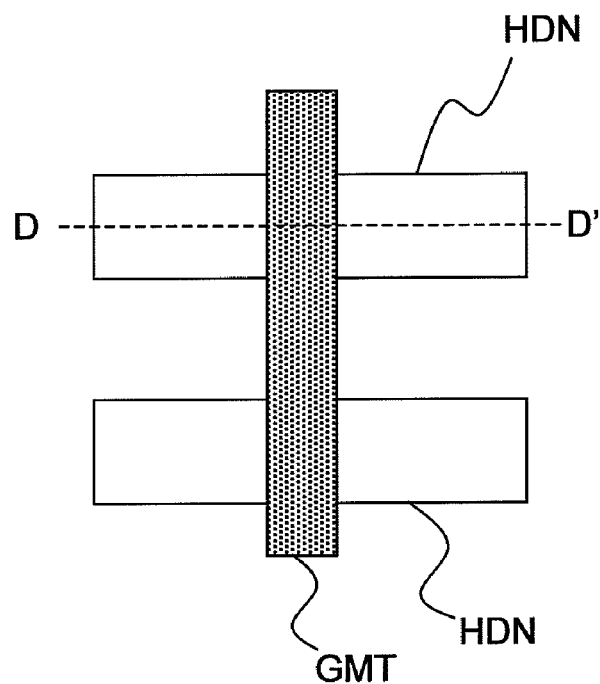
FIG. 8A is a planar layout view illustrating a process for manufacturing the image display device of Embodiment 1 of the present invention.
Figure 8B:
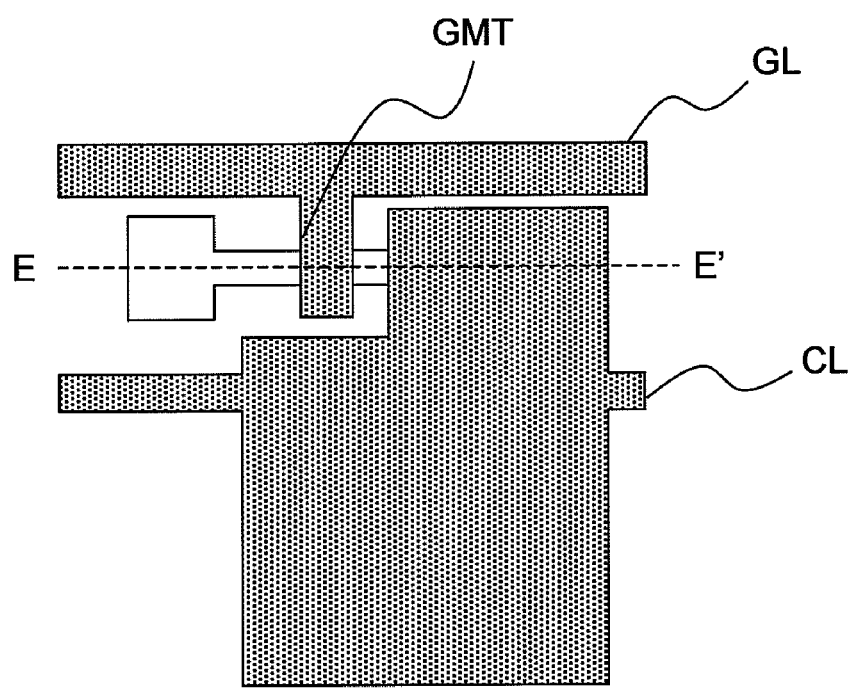
FIG. 8B is a planar layout view that is a continuation of the view shown in FIG. 8A and illustrates a process for manufacturing the image display device of Embodiment 1 of the present invention.
Figure 9C:
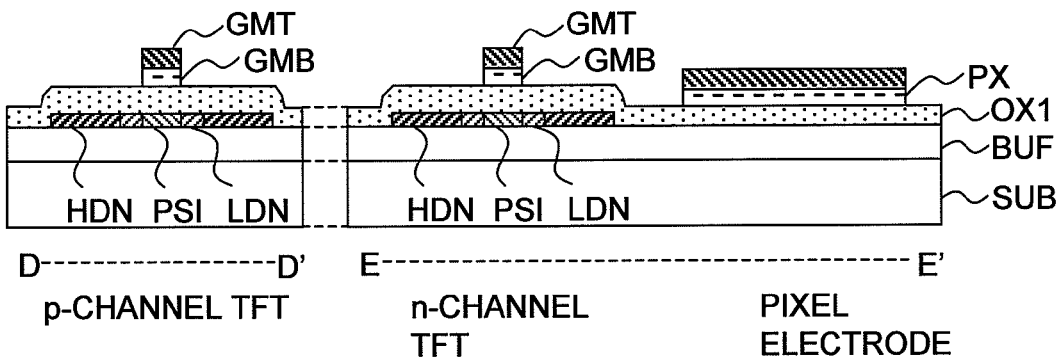
FIG. 9C is a cross-sectional view that is a continuation of the view shown in FIG. 9B and illustrates a process for manufacturing the image display device of Embodiment 1 of the present invention.

A highly-doped n-type polycrystalline silicon layer HDN is then formed by ion implantation of phosphorus performed by using the resist as a mask. The resist is removed, the ITO is removed by using the gate top electrode GTM as a mask, and a lightly-doped n-type polycrystalline silicon layer LDN is formed by ion implantation of phosphorus (FIG. 9C and FIGS. 8A, 8B).

Figure 9D:
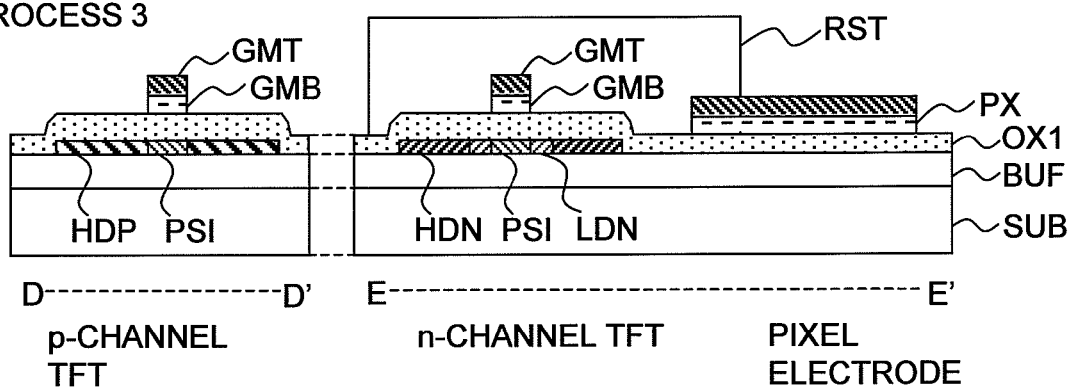
FIG. 9D is a cross-sectional view that is a continuation of the view shown in FIG. 9C and illustrates a process for manufacturing the image display device of Embodiment 1 of the present invention.
Figure 9E:
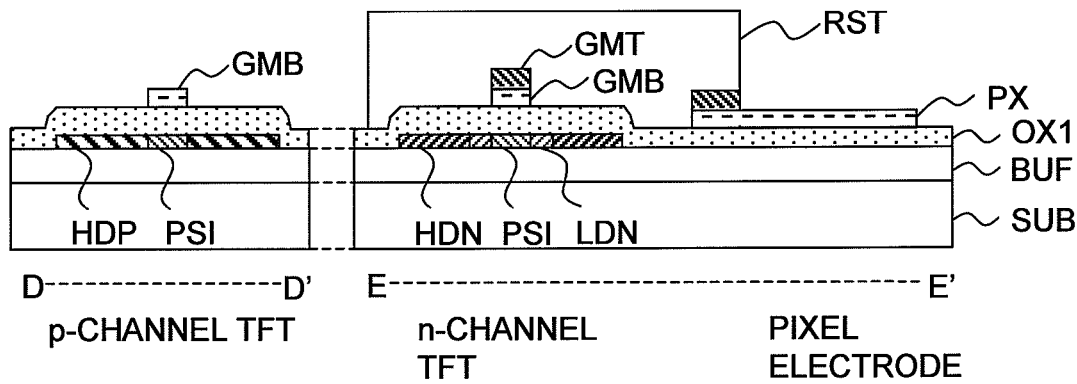
FIG. 9E is a cross-sectional view that is a continuation of the view shown in FIG. 9D and illustrates a process for manufacturing the image display device of Embodiment 1 of the present invention.

A region of the n-channel TFT is then covered with a resist by a well-known photolithography process (photo process 3), and a highly-doped p-type polycrystalline silicon layer HDP is formed by ion implantation of boron performed by using the resist as a mask (FIG. 9D). Tungsten located on the pixel electrode and gate top electrode GMT is then removed and a pixel electrode PX and a gate electrode GMB of the p-channel TFT are formed (FIG. 9E). Phosphorus ions are then implanted to adjust the threshold value of the p-channel TFT. At this time, because the gate bottom electrode GMB that is the gate electrode of the p-channel TFT is as thin as 30 nm, phosphorus ions are implanted into the polycrystalline silicon layer PSI located below the gate bottom electrode. Furthermore, at this time, phosphorus ions are also implanted into the highly-doped p-type polycrystalline silicon layer HDP, but because the concentration of the implanted phosphorus ions is sufficiently lower than the concentration of boron in the highly-doped p-type polycrystalline silicon layer, the resistance of the highly-doped p-type polycrystalline silicon layer HDP practically does not change.

Figure 8C:
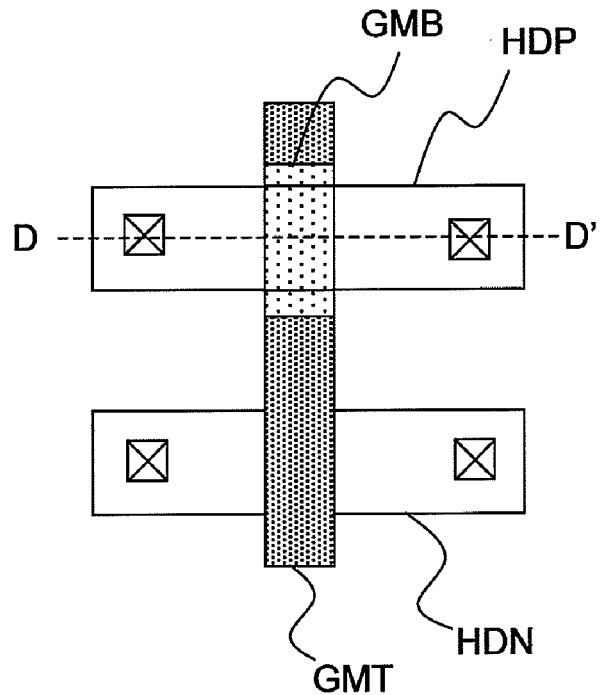
FIG. 8C is a planar layout view that is a continuation of the view shown in FIG. 8B and illustrates a process for manufacturing the image display device of Embodiment 1 of the present invention.
Figure 8D:
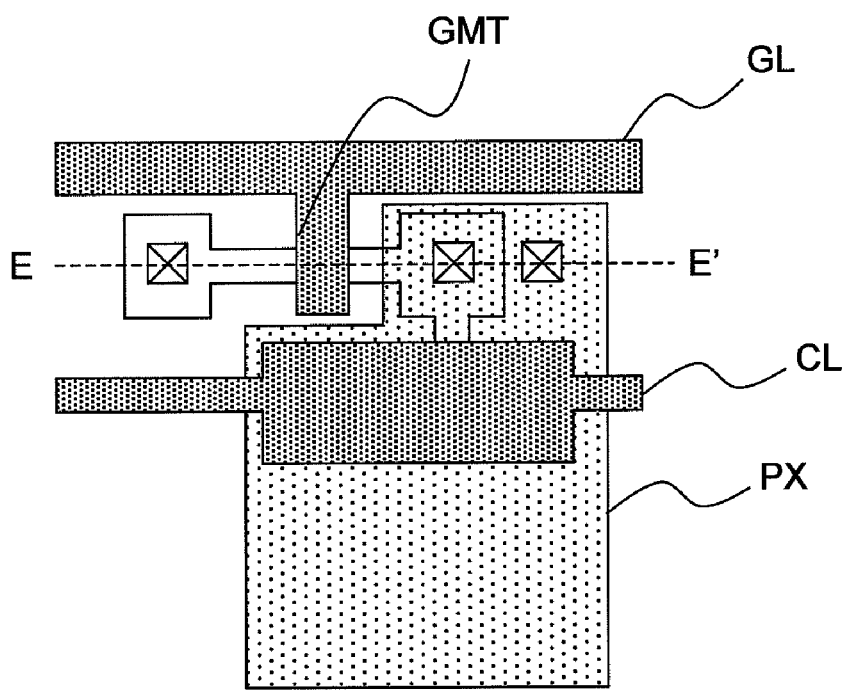
FIG. 8D is a planar layout view that is a continuation of the view shown in FIG. 8C and illustrates a process for manufacturing the image display device of Embodiment 1 of the present invention.

An interlayer insulating film OX2 comprising silicon oxide and a passivation film PAS comprising silicon nitride are then formed by plasma enhanced chemical vapor deposition so as to cover the entire surface, and a contact hole CNT1 is formed by a well-known photo photolithography-etching process (photo process 4) (FIG. 8C, FIG. 8D).

Figure 9F:
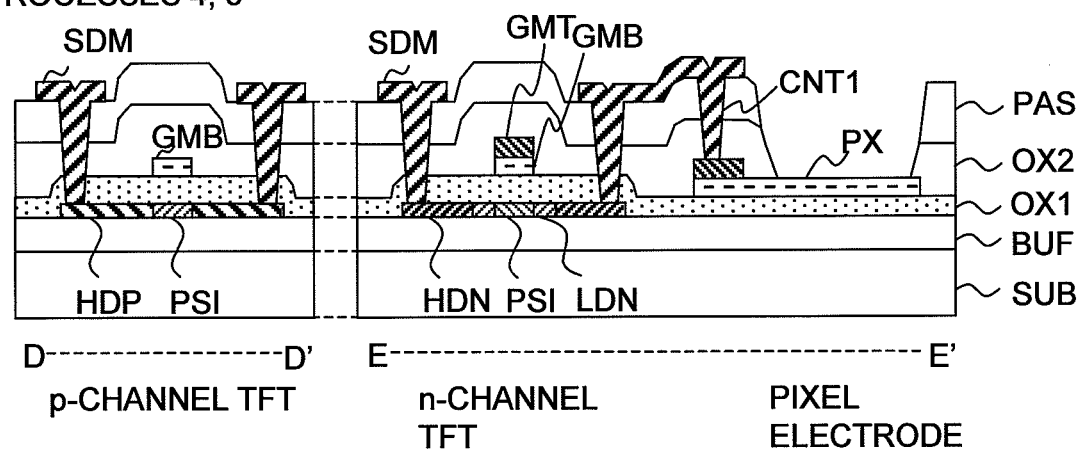
FIG. 9F is a cross-sectional view that is a continuation of the view shown in FIG. 9E and illustrates a process for manufacturing the image display device of Embodiment 1 of the present invention.

A metal layer comprising aluminum is then deposited and a source/drain electrode SDM and a signal line SL are then formed by a well-known photo photolithography-etching process (photo process 5) (FIG. 9F). The source/drain electrode SDM and the signal line SL have a laminated structure and a barrier layer comprising tungsten is present at the lower film in order to decrease contact resistance of the source/drain electrode SDM and the highly-doped polycrystalline silicon layer. The barrier film thickness is preferably 50 to 150 nm and the aluminum film thickness is preferably 400 to 600 nm.

According to Embodiment 1, by performing ion implantation for adjusting the threshold value of the p-channel TFT through the gate bottom electrode GMB, it is possible to use the resist mask produced to form a highly-doped p-type polycrystalline silicon layer HDP together with a resist mask produced to perform ion implantation for adjusting the threshold value of the p-channel TFT. Therefore, a photolithographic process can be reduced. In this case, the film thickness of the gate underplayed electrode GMB is preferably 20 to 60 nm.

Furthermore, according to Embodiment 1, because tungsten of the pixel portion is also removed simultaneously with the removal of the gate top electrode (tungsten) when a gate electrode of the p-channel TFT is formed, the pixel electrode PX and gate electrode GMB of the p-channel TFT can be formed at the same time. Therefore, the photolithographic process can be further reduced and a low-cost image display device can be provided.

Embodiment 2

Figure 10:
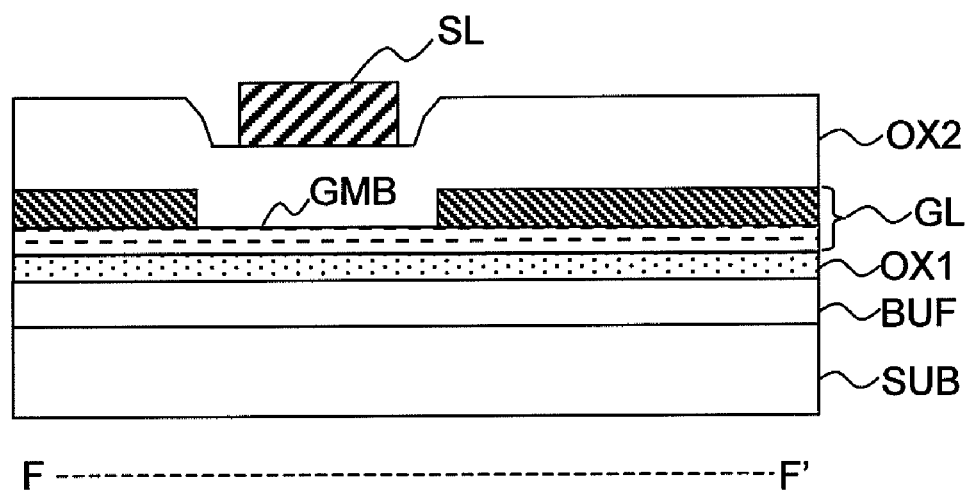
FIG. 10 is a cross-sectional view of an intersection portion of gate lines and signal lines of Embodiment 2 of the image display device in accordance with the present invention.

FIG. 10 is a cross sectional view along F-F' in FIG. 7 that illustrates Embodiment 2 of the present invention. FIG. 10 shows a structure in which tungsten of the intersection portion of the gate line GL and the signal line SL was removed simultaneously with the removal of the gate top electrode GMT (tungsten) when the gate electrode of the p-channel TFT in Embodiment 1 was formed. According to Embodiment 2, because the film thickness of the gate line in the intersection portion of the gate line GL and the signal line SL can be decreased, the signal line SL can be prevented from disconnecting and yield is increased.

Embodiment 3

Figure 2:
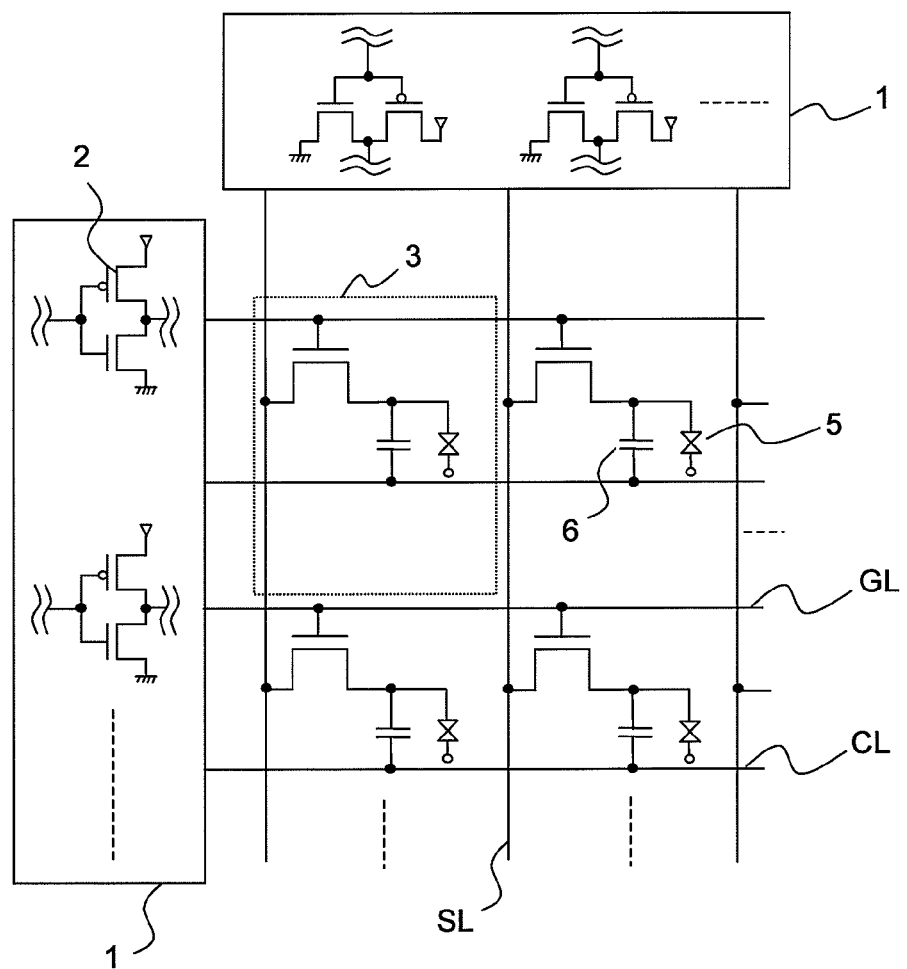
FIG. 2 is a circuit diagram of a liquid crystal display device as an example of the conventional image display device.
Figure 3:
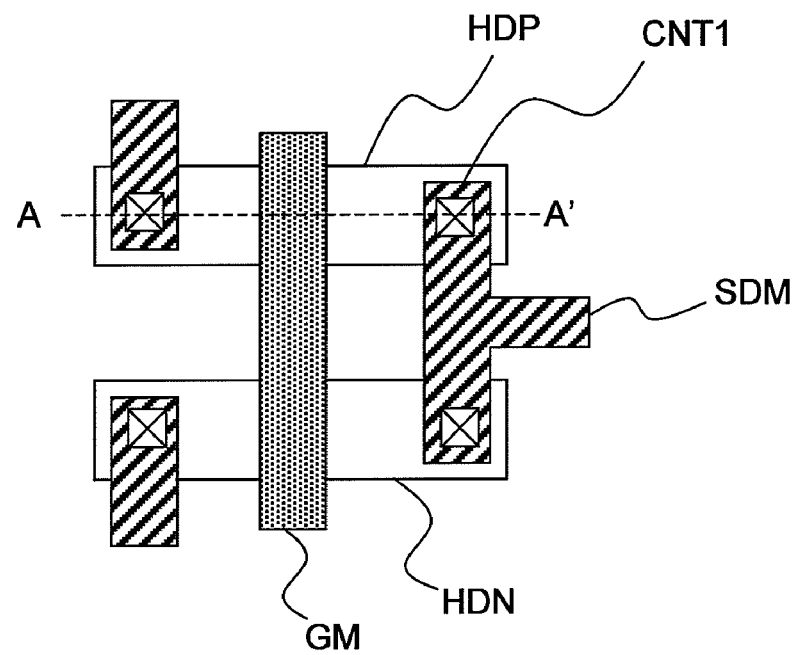
FIG. 3 is a planar layout view of a CMOS thin-film transistor in the conventional image display device.
Figure 11:
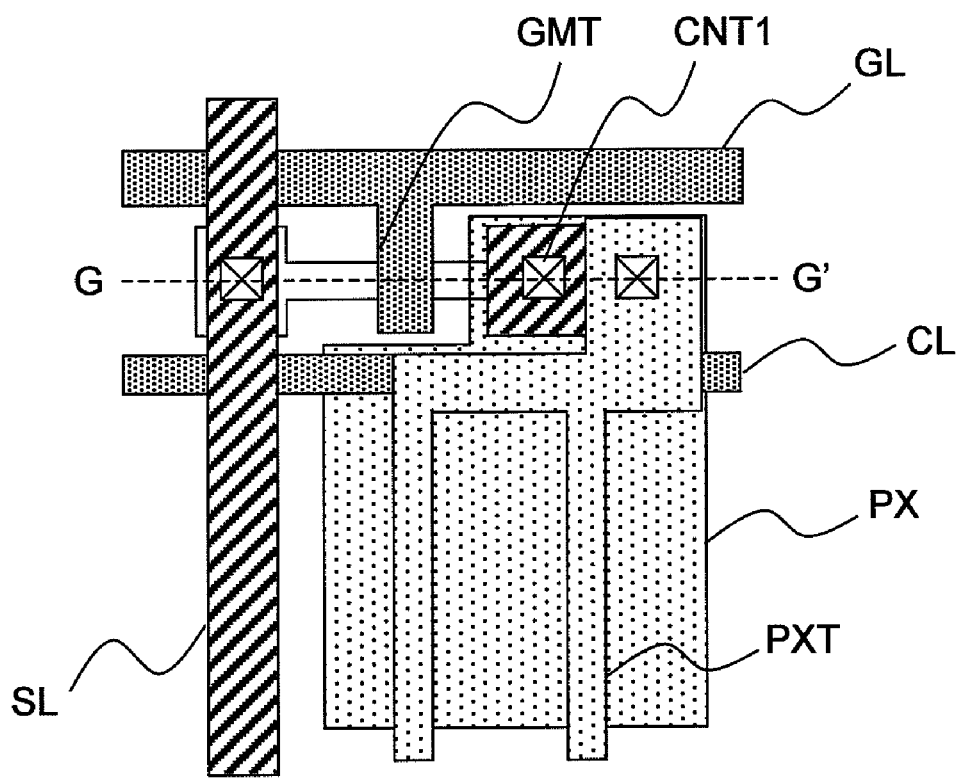
FIG. 11 is a planar layout view of pixels in the image display device of Embodiment 3 of the image display device in accordance with the present invention.
Figure 12:
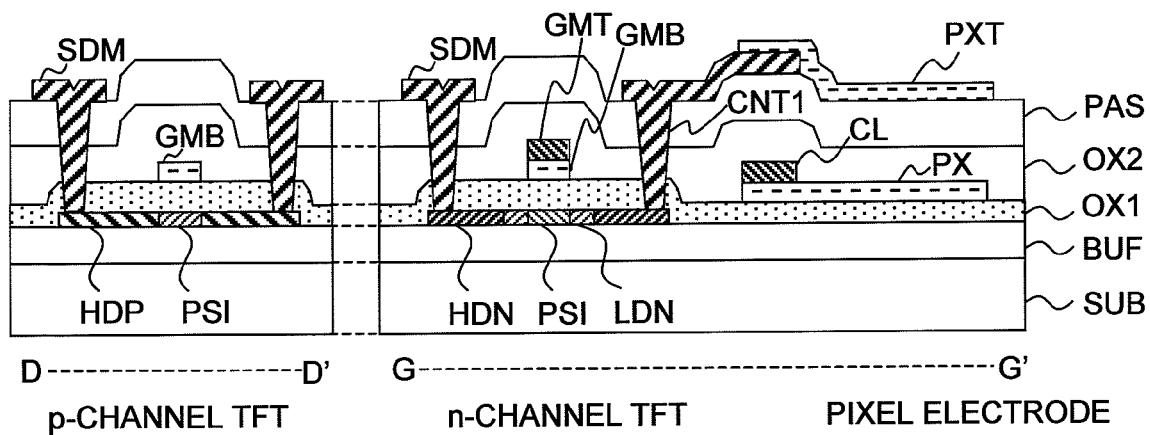
FIG. 12 is a cross-sectional view of a thin-film transistor and a pixel electrode of Embodiment 3 of the image display device in accordance with the present invention.

FIG. 11 is a plan view of the portion corresponding to the pixel 3 of FIG. 2 that illustrates Embodiment 3 of the present invention. The plan view of the CMOS 2 is identical to that shown in FIG. 6. FIG. 12 shows a cross-sectional view corresponding to D-D' in FIG. 6 and a cross-sectional view corresponding to G-G' in FIG. 11. The process preceding the formation of the source/drain electrode SDM is identical to that of Embodiment 1, but in Embodiment 3 an upper pixel electrode PXT comprising ITO is present on the source/drain electrode. The source/drain electrode also has a barrier film on the upper side thereof to reduce the contact resistance with the upper pixel electrode PXT. According to Embodiment 3, an optically transparent capacitor element can be formed by using the pixel electrode and the upper pixel electrode. Therefore, the structural portion of the storage capacitor can be made transparent and the aperture ratio of the pixel is increased.

Embodiment 4

Figure 13:
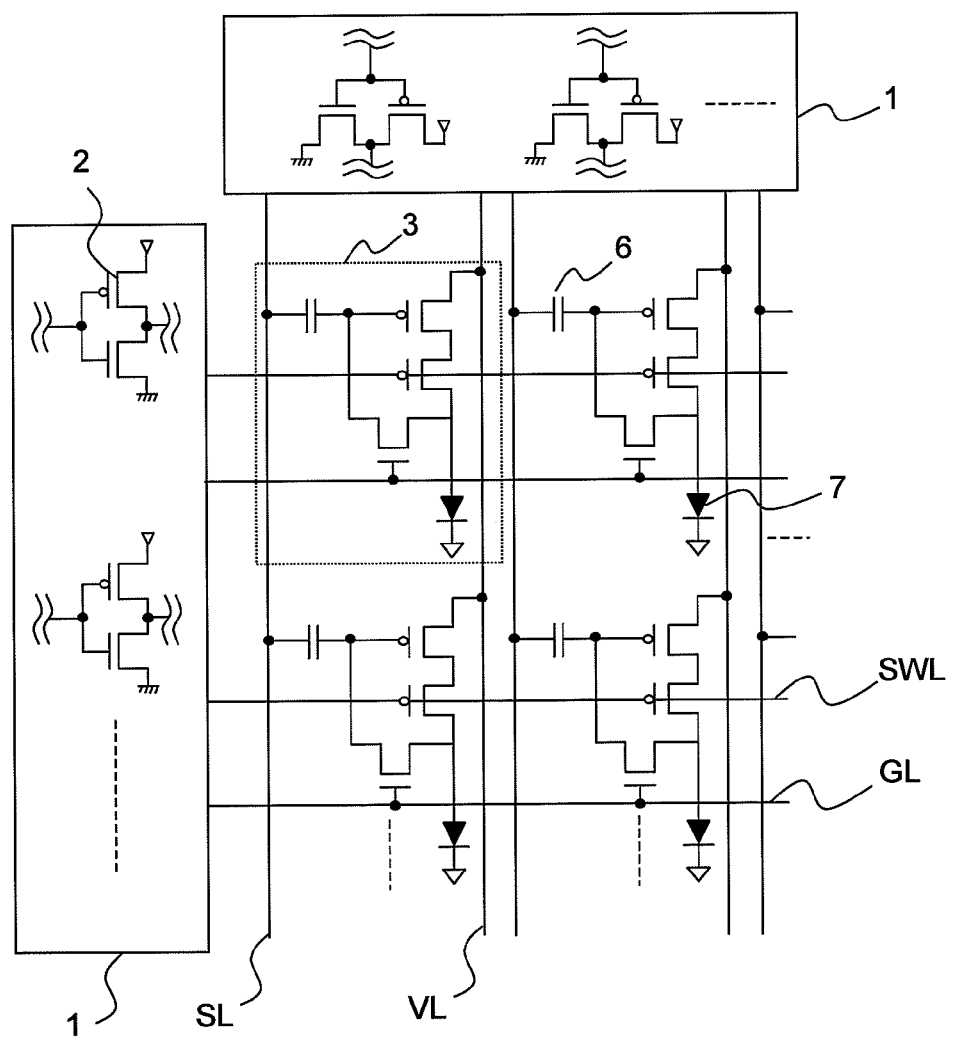
FIG. 13 is a configuration drawing of Embodiment 4 of the image display device in accordance with the present invention.
Figure 14:
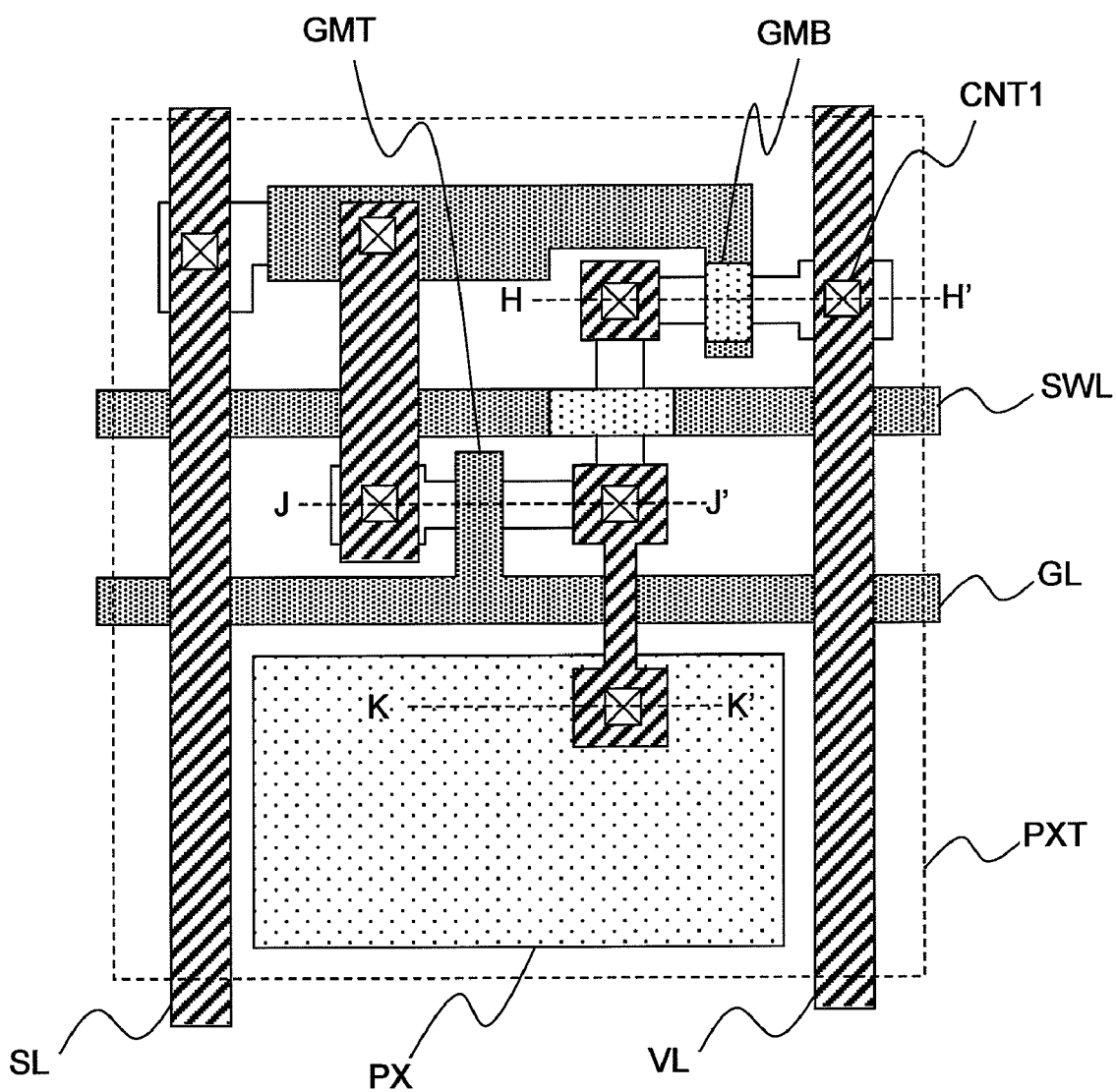
FIG. 14 is a planar layout view of pixels in Embodiment 4 of the image display device in accordance with the present invention.

FIG. 13 shows a circuit configuration of the image display device that illustrates Embodiment 4 of the present invention. FIG. 14 is a plan view of the pixel portion 3 shown in FIG. 13. The plan view of the CMOS 2 constituting the peripheral driver circuit is identical to that shown in FIG. 6. The pixel portion is composed of an n-channel TFT, a p-channel TFT, and an organic light emitting layer. A method for manufacturing the image display device of Embodiment 4 will be explained with FIGS. 15A to 15B and FIGS. 16A to 16E by using the cross-sectional view along H-H', cross-sectional view along J-J', and cross-sectional view along K-K' in FIG. 14.

Figure 16A:
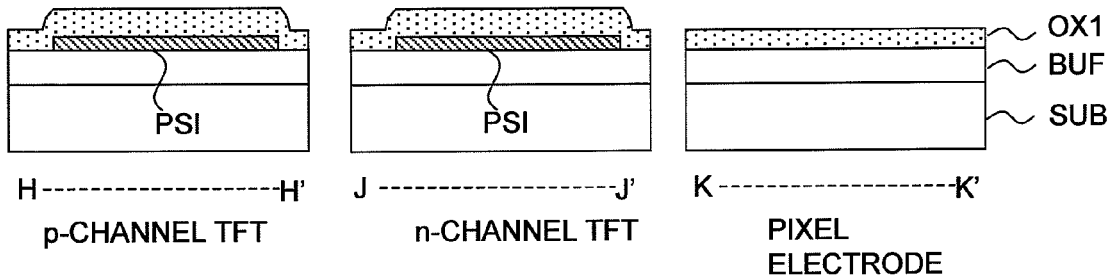
FIG. 16A is a cross-sectional view illustrating a process for manufacturing the image display device of Embodiment 4 of the present invention.

In a method for manufacturing the image display device of Embodiment 4, the steps preceding the formation of the interlayer insulating film OX2 are identical to those of Embodiment 1. Thus, a silicon oxide film BUF is deposited to a thickness of 100 nm as a buffer layer on a glass substrate SUB, and then an amorphous silicon layer is deposited to a thickness of 50 nm by plasma enhanced chemical vapor deposition. The amorphous silicon layer is then crystallized by irradiation with a XeCl excimer laser beam, and an island-like polycrystalline silicon layer PSI is obtained by a well-known photo photolithography-etching process (photo process 1). A gate insulating film OX1 is then deposited to a thickness of 100 nm by plasma enhanced chemical vapor deposition and boron ions are implanted to adjust the threshold value of the n-channel TFT (FIG. 16A).

An ITO with a film thickness of 30 nm and a laminated metal film comprising tungsten and having a film thickness of 150 nm are then deposited. A resist mask is formed by patterning a gate electrode GM, a gate line GL, a switch line SWL, and a pixel electrode PX by a well-known photolithography process (photo process 2), side etching of a gate top electrode GMT (tungsten) is performed by well-known wet etching and the electrode is reduced in size by 0.5 to 1.0 μm with respect to the resist.

Figure 15A:
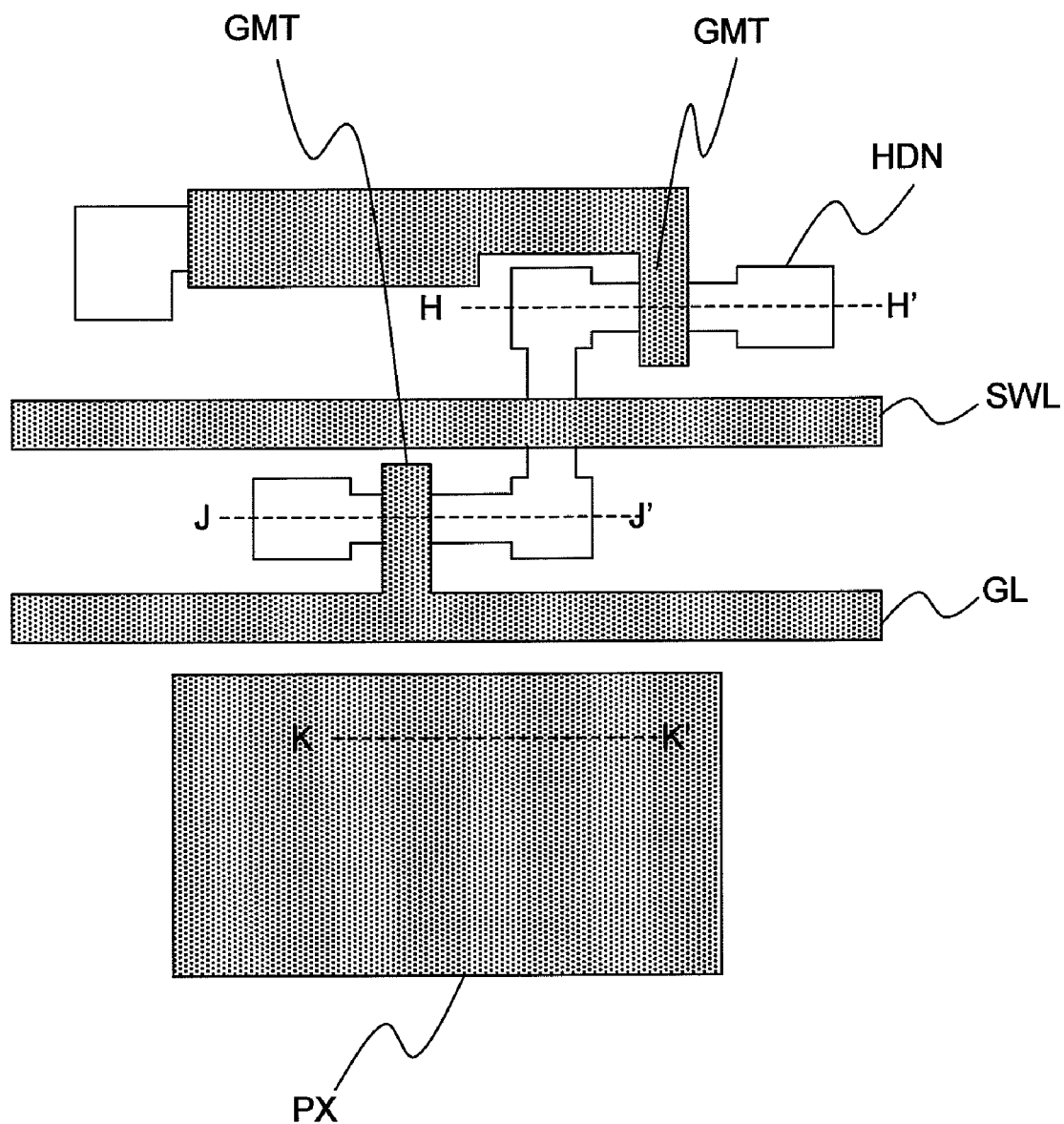
FIG. 15A is a planar layout view of pixels illustrating a process for manufacturing the image display device of Embodiment 4 of the present invention.
Figure 16B:
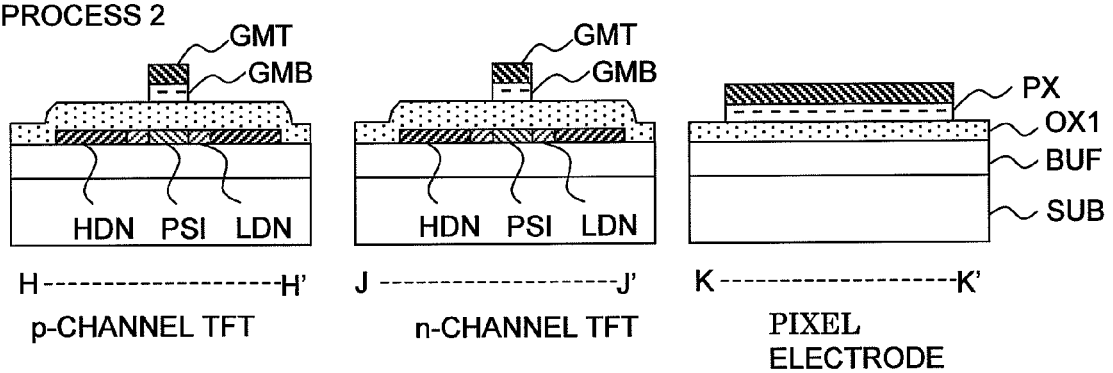
FIG. 16B is a cross-sectional view that is a continuation of the view shown in FIG. 16A and illustrates a process for manufacturing the image display device of Embodiment 4 of the present invention.

A highly-doped n-type polycrystalline silicon layer HDN is then formed by ion implantation of phosphorus performed by using the resist as a mask. The resist is removed, the ITO is removed by using the gate top electrode GTM as a mask, and a lightly-doped n-type polycrystalline silicon layer LDN is thereafter formed by ion implantation of phosphorus (FIG. 16B and FIG. 15A).

Figure 16C:
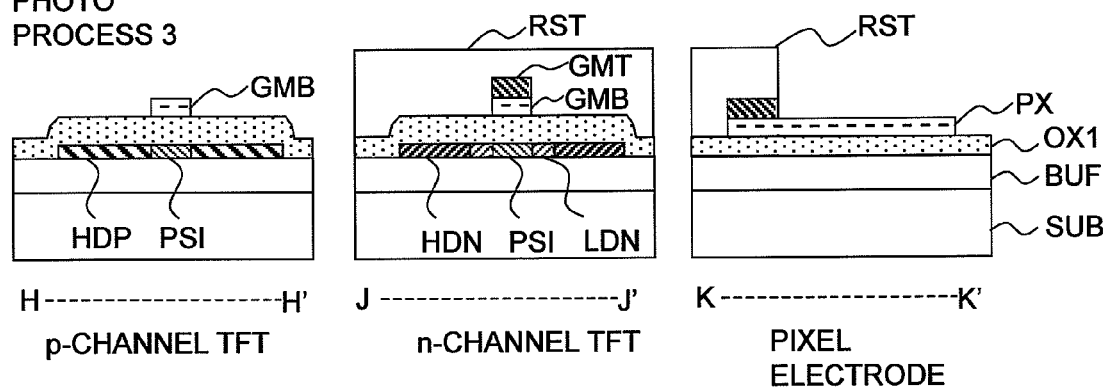
FIG. 16C is a cross-sectional view that is a continuation of the view shown in FIG. 16B and illustrates a process for manufacturing the image display device of Embodiment 4 of the present invention.

A region of the n-channel TFT is then covered with a resist by a well-known photolithography process (photo process 3), and a highly-doped p-type polycrystalline silicon layer HDP is formed by ion implantation of boron performed by using the resist as a mask. Tungsten located on the pixel electrode and gate top electrode GMT is then removed and a pixel electrode PX and a gate electrode GMB of the p-channel TFT are formed (FIG. 16C).

Phosphorus ions are then implanted to adjust the threshold value of the p-channel TFT. At this time, because the gate bottom electrode GMB that is the gate electrode of the p-channel TFT is as thin as 30 nm, phosphorus ions are implanted into the polycrystalline silicon layer PSI located below the gate bottom electrode. Furthermore, at this time, phosphorus ions are also implanted into the highly-doped p-type polycrystalline silicon layer HDP, but because the concentration of the implanted phosphorus ions is sufficiently lower than the concentration of boron in the highly-doped p-type polycrystalline silicon layer, the resistance of the highly-doped p-type polycrystalline silicon layer HDP practically does not change.

Figure 15B:
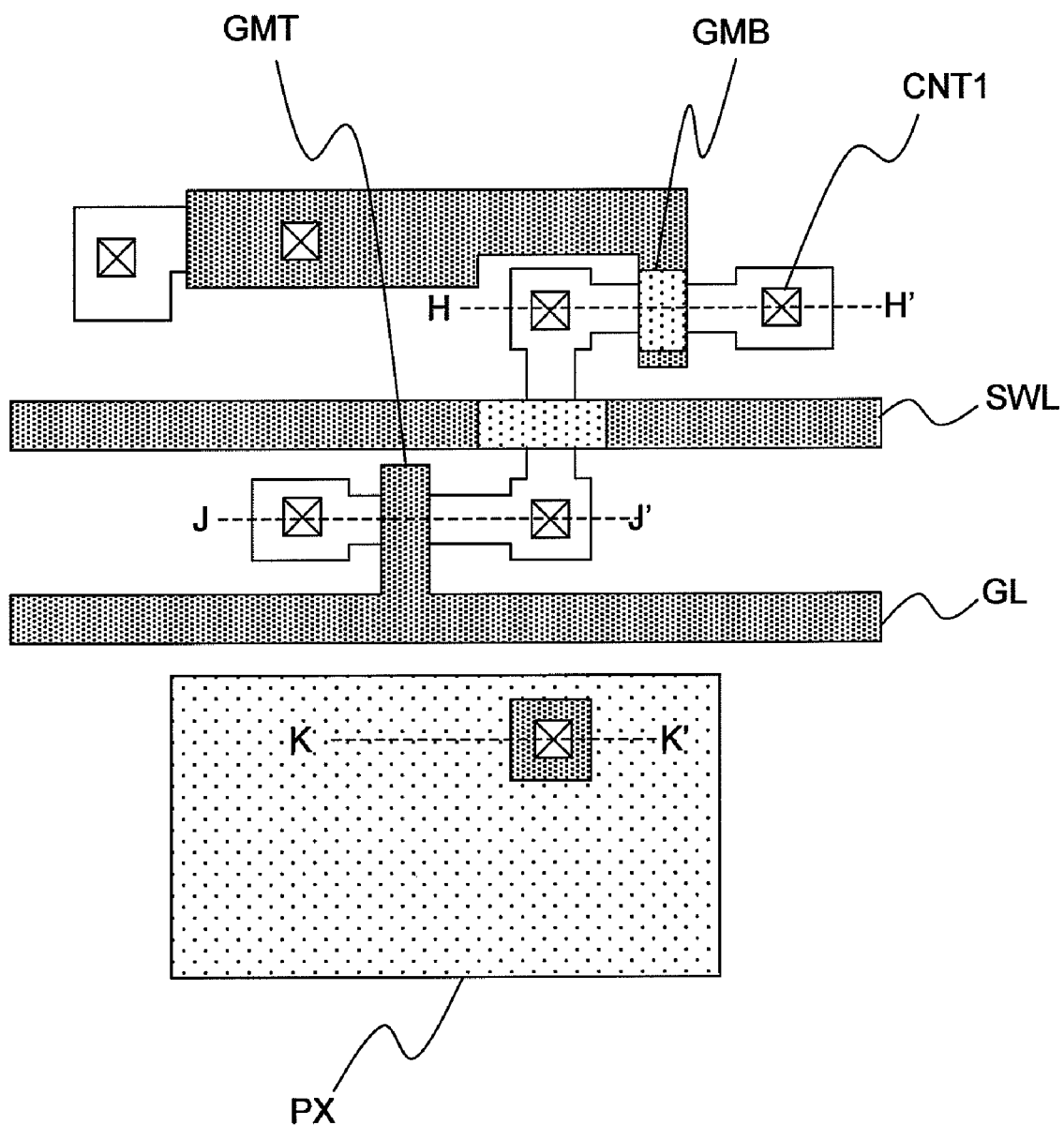
FIG. 15B is a planar layout view that is a continuation of the view shown in FIG. 15A and illustrates a process for manufacturing the image display device of Embodiment 4 of the present invention.
Figure 16D:
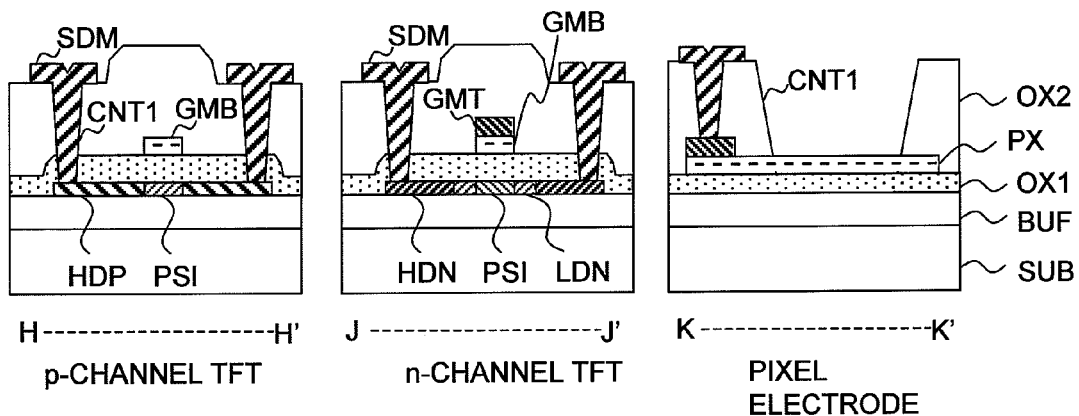
FIG. 16D is a cross-sectional view that is a continuation of the view shown in FIG. 16C and illustrates a process for manufacturing the image display device of Embodiment 4 of the present invention.

After the resist PST has been removed, an interlayer insulating film OX2 comprising silicon oxide is formed by plasma enhanced chemical vapor deposition so as to cover the entire surface, and a contact hole CNT1 is formed by a well-known photo photolithography-etching process (photo process 4) (FIG. 15B). A metal layer comprising aluminum is then deposited and a source/drain electrode SDM, a signal line SL, and a power line VL are then formed by a well-known photo photolithography-etching process (photo process 5) (FIG. 16D).

Figure 16E:
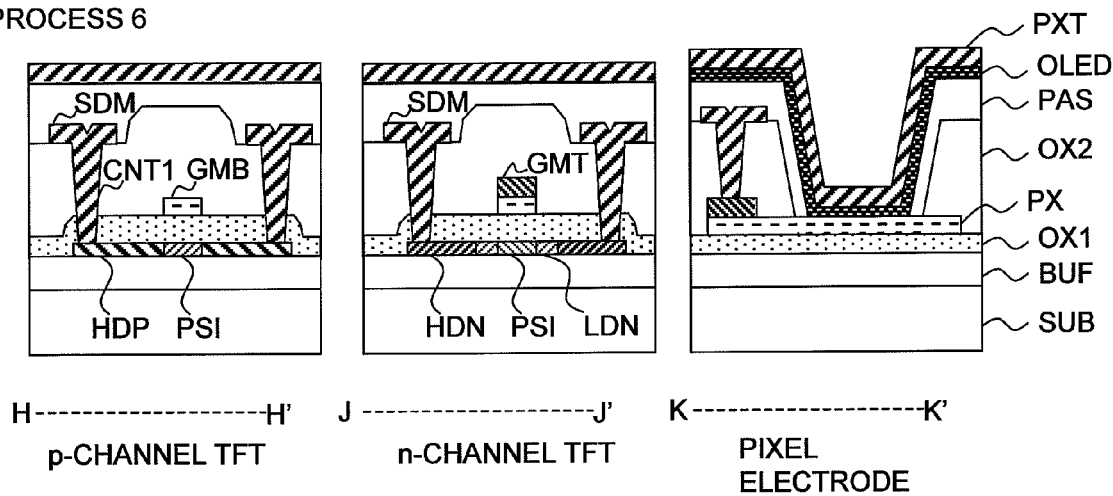
FIG. 16E is a cross-sectional view that is a continuation of the view shown in FIG. 16D and illustrates a process for manufacturing the image display device of Embodiment 4 of the present invention.

The source/drain electrode SDM and the signal line SL have a laminated structure and a barrier layer comprising tungsten is present at the lower film in order to decrease contact resistance of the source/drain electrode SDM and the highly-doped polycrystalline silicon layer. The barrier film thickness is preferably 50 to 150 nm and the aluminum film thickness is preferably 400 to 600 nm. Then, a passivation film PAS comprising silicon nitride is formed and the passivation film PAS located on the pixel electrode is removed by a well-known photo photolithography-etching process (photo process 6). A light-emitting layer OLED comprising an organic material is deposited by a well-known mask vapor deposition and then an upper pixel electrode PXT comprising aluminum is formed (FIG. 16E).

According to Embodiment 4, because the light emitting layer OLED comprising an organic material is present on a glass substrate, an image display device that is superior to liquid crystal display devices in view angle dependence and dynamic image display can be provided. Furthermore, a liquid crystal display device requires two glass substrate, whereas the image display device of the present embodiments can be configured by using only one substrate. Therefore, a thin image display device can be provided.

Embodiment 5

Figure 17:
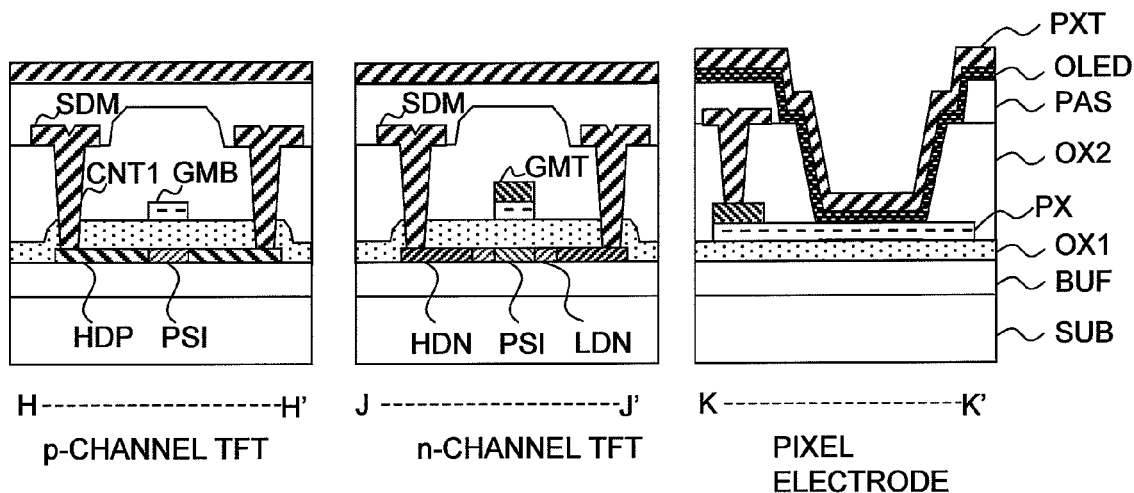
FIG. 17 is a cross-sectional view of a thin-film transistor and a pixel electrode of Embodiment 5 of the image display device in accordance with the present invention.

FIG. 17 shows cross-sectional views corresponding to a cross-sectional view along H-H', a cross-sectional view along J-J', and a cross-sectional view along K-K' in FIG. 14 and serving to explain Embodiment 5 of the present invention. In the structure shown in FIG. 17, the passivation film PAS is patterned in the process of Embodiment 4 so that the passivation film PAS does not come into contact with the pixel electrode PX, and then the light emitting layer OLED comprising an organic material is formed. According to the present embodiment, by forming the light emitting layer OLED comprising an organic material so that it is in contact with the upper portion of the pixel electrode PX and the side portion and upper portion of the interlayer insulating film OX2, the light emitting surface area can be enlarged and the aperture ratio of pixels can be increased.

Embodiment 6

Figure 18:
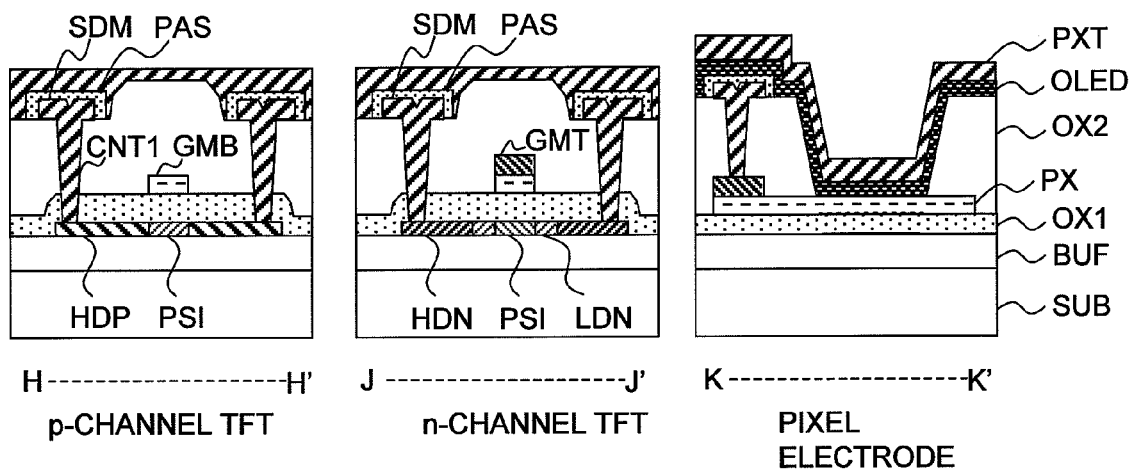
FIG. 18 is a cross-sectional view of a thin-film transistor and a pixel electrode of Embodiment 6 of the image display device in accordance with the present invention.

FIG. 18 shows cross-sectional views corresponding to a cross-sectional view along H-H', a cross-sectional view along J-J', and a cross-sectional view along K-K' in FIG. 14 and serving to explain Embodiment 6 of the present invention. In the structure shown in FIG. 18, after the source/drain electrode SDM has been formed in the process of Embodiment 4, an aluminum oxide film is formed as a passivation film PAS on the surface of the source/drain electrode by an anodization method, and then a light emitting layer comprising an organic material is formed. Because, the upper film of the source/drain electrode is an aluminum film, aluminum oxide is formed by anodization. Accordingly to Embodiment 6, because the photo photolithography-etching process of patterning the passivation film PAS can be reduced, an image display device with a lower cost can be provided.

Embodiment 7

Figure 19:
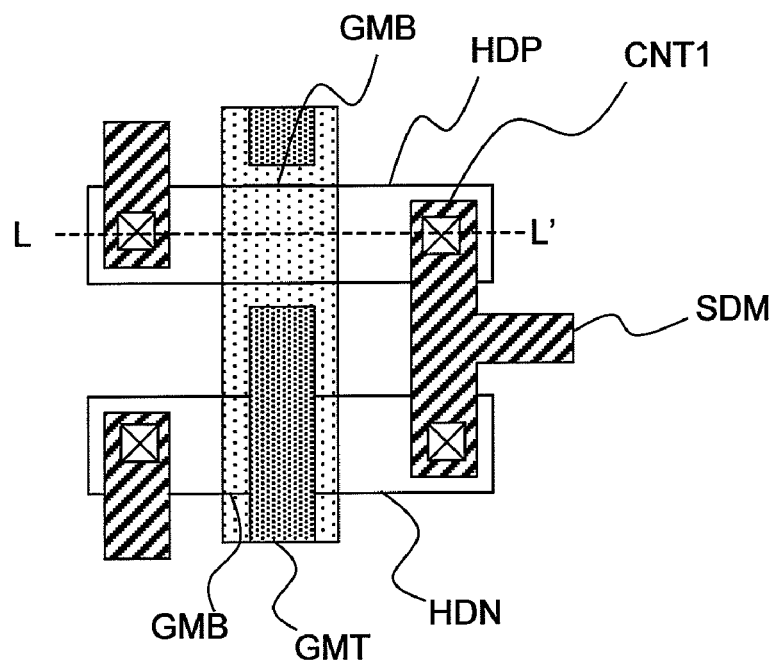
FIG. 19 is a planar layout view of a CMOS thin-film transistor in Embodiment 7 of the image display device in accordance with the present invention.
Figure 20:
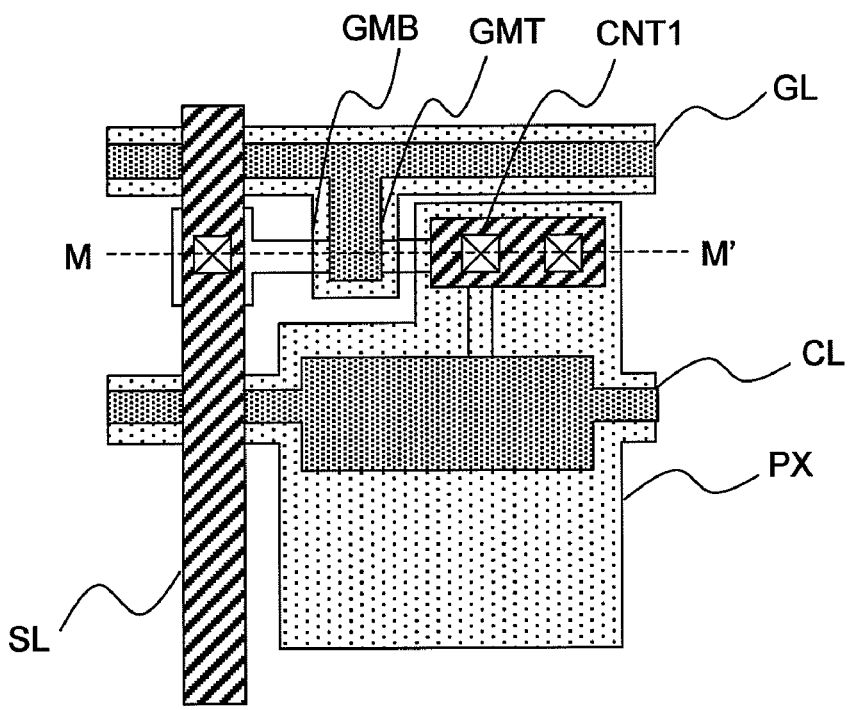
FIG. 20 is a planar layout view of a pixel in Embodiment 7 of the image display device in accordance with the present invention.

The configuration of the image display device of Embodiment 7 is identical to that shown in FIG. 2. FIG. 19 and FIG. 20 show a plan view of a CMOS 2 constituting a peripheral driver circuit and a plan view of a pixel 3, respectively. A method for manufacturing the image display device of Embodiment 7 will be explained below with reference to FIGS. 21A to 21F by using a cross-sectional view along L-L' in FIG. 19 and a cross-sectional view along M-M' in FIG. 20.

FIGS. 21A to 21F are cross-sectional views illustrating a process for manufacturing the image display device of Embodiment 7 of the present invention. First, similarly to Embodiment 1, a silicon oxide film BUF is deposited to a thickness of 100 nm as a buffer layer on a glass substrate SUB, and then an amorphous silicon layer is deposited to a thickness of 50 nm by plasma enhanced chemical vapor deposition. The amorphous silicon layer is then crystallized by irradiation with a XeCl excimer laser beam, and an island-like polycrystalline silicon layer PSI is obtained by a well-known photo photolithography-etching process (photo process 1).

Figure 21A:
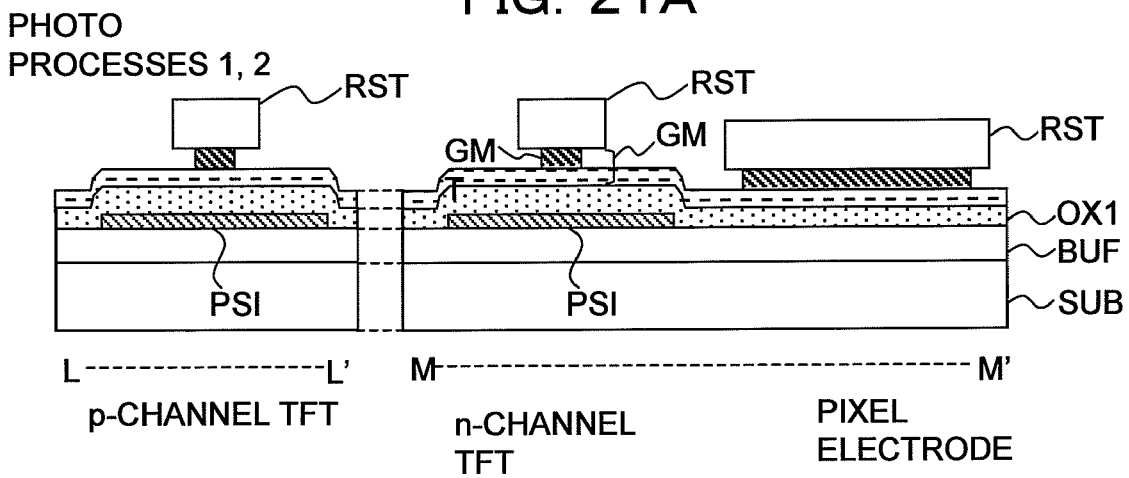
FIG. 21A is a cross-sectional view illustrating a process for manufacturing the image display device of Embodiment 7 of the present invention.

A gate insulating film OX1 is then deposited to a thickness of 100 nm by plasma enhanced chemical vapor deposition and boron ions are implanted to adjust the threshold value of the n-channel TFT. An ITO with a film thickness of 50 nm and a laminated metal film comprising tungsten and having a film thickness of 150 nm are then deposited. A resist mask is formed by patterning a gate electrode GM, a gate line GL, and a pixel electrode PX by a well-known photolithography process (photo process 2), side etching of a gate top electrode GMT (tungsten) is performed by well-known wet etching and the electrode is reduced in size by 0.5 to 1.0 µm with respect to the resist (FIG. 21A).

Figure 21B:
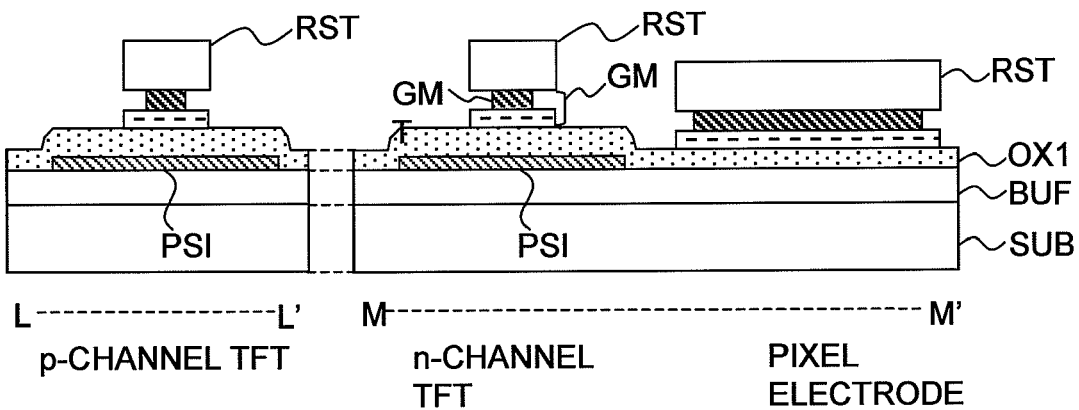
FIG. 21B is a cross-sectional view that is a continuation of the view shown in FIG. 21A and illustrates a process for manufacturing the image display device of Embodiment 7 of the present invention.
Figure 21C:
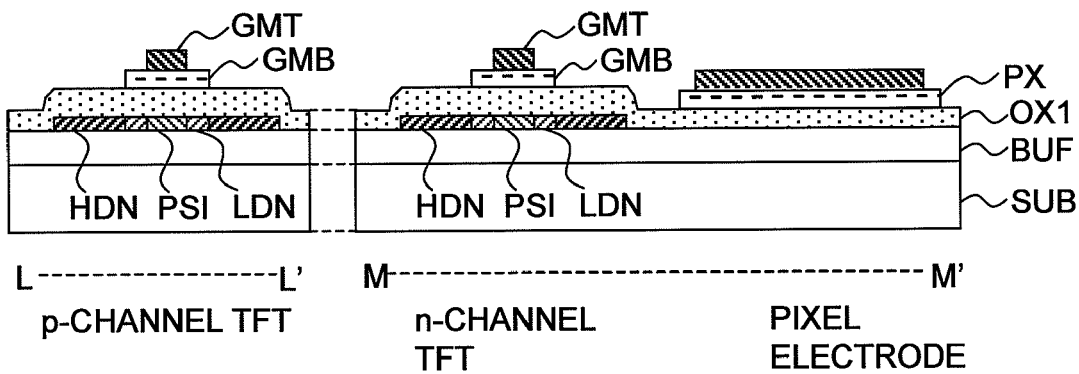
FIG. 21C is a cross-sectional view that is a continuation of the view shown in FIG. 21B and illustrates a process for manufacturing the image display device of Embodiment 7 of the present invention.

The ITO is then removed by well-known etching by using the resist as a mask (FIG. 21B). A highly-doped n-type polycrystalline silicon layer HDN and a lightly-doped n-type polycrystalline silicon layer LDN are then formed by ion implantation of phosphorus performed by using the gate top electrode GMT as a mask. Because ion implantation is performed through the gate top electrode GMT, the highly-doped n-type polycrystalline silicon layer HDN and the lightly-doped n-type polycrystalline silicon layer LDN can be formed simultaneously by one cycle of ion implantation (FIG. 21C).

Figure 21D:
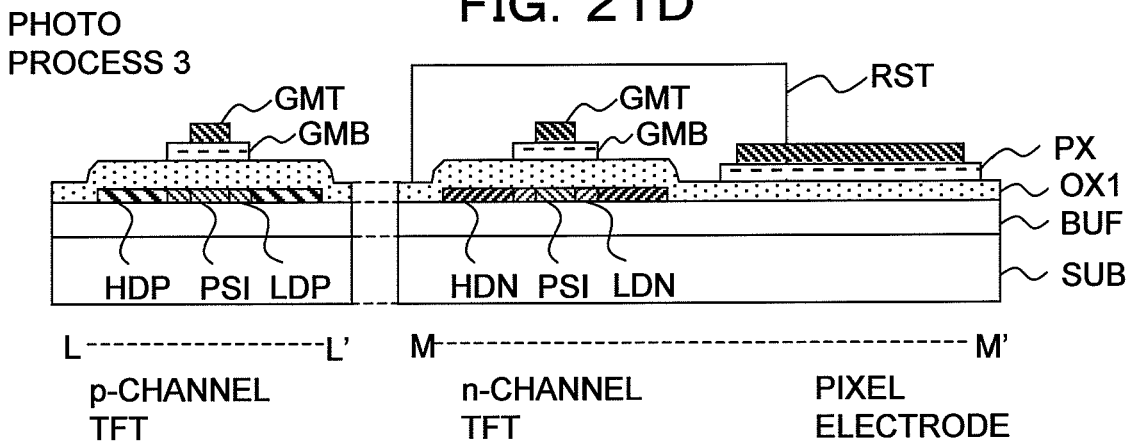
FIG. 21D is a cross-sectional view that is a continuation of the view shown in FIG. 21C and illustrates a process for manufacturing the image display device of Embodiment 7 of the present invention.
Figure 21E:
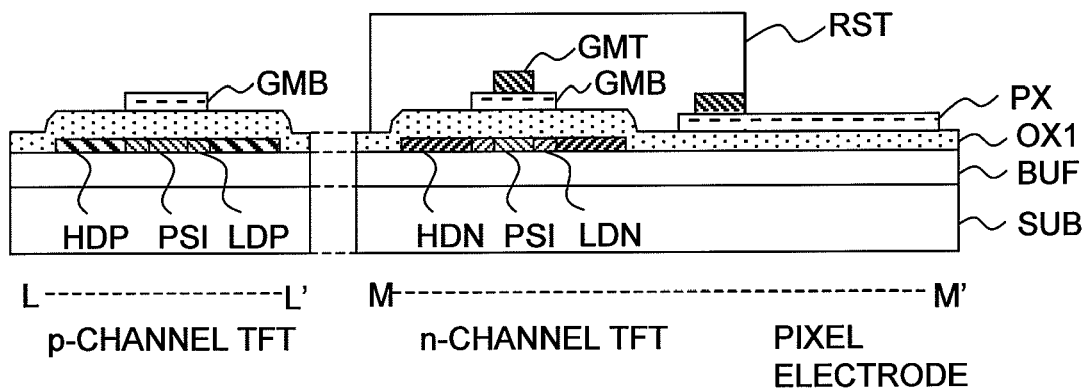
FIG. 21E is a cross-sectional view that is a continuation of the view shown in FIG. 21D and illustrates a process for manufacturing the image display device of Embodiment 7 of the present invention.

A region of the n-channel TFT is then covered with a resist by a well-known photolithography process (photo process 3), and a highly-doped p-type polycrystalline silicon layer HDP and a lightly-doped p-type polycrystalline silicon layer LDP are formed by ion implantation of boron performed by using the resist as a mask (FIG. 21D). Tungsten located on the pixel electrode and gate top electrode GMT is then removed and a pixel electrode PX and a gate electrode GMB of the p-channel TFT are formed (FIG. 21E).

Phosphorus ions are then implanted to adjust the threshold value of the p-channel TFT. At this time, because the gate bottom electrode GMB is as thin as 50 nm, phosphorus ions are implanted into the polycrystalline silicon layer PSI located below the gate bottom electrode. Furthermore, at this time, phosphorus ions are also implanted into the highly-doped p-type polycrystalline silicon layer HDP and the lightly-doped p-type polycrystalline silicon layer LDP, but because the concentration of the implanted phosphorus ions is sufficiently lower than the concentration of boron in the highly-doped p-type polycrystalline silicon layer and the lightly-doped p-type polycrystalline silicon layer LDP, the resistance of the highly-doped p-type polycrystalline silicon layer HDP and the lightly-doped p-type polycrystalline silicon layer LDP practically does not change.

Figure 21F:
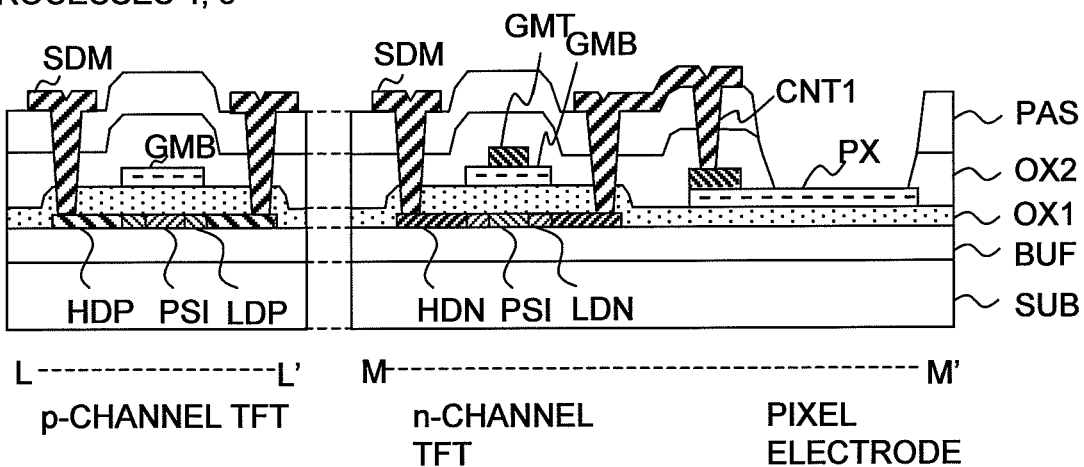
FIG. 21F is a cross-sectional view that is a continuation of the view shown in FIG. 21E and illustrates a process for manufacturing the image display device of Embodiment 7 of the present invention.

An interlayer insulating film OX2 and a passivation film PAS are then formed by plasma enhanced chemical vapor deposition so as to cover the entire surface, and a contact hole CNT1 is formed by a well-known photo photolithography-etching process (photo process 4). A metal layer comprising aluminum is then deposited and a source/drain electrode SDM and a signal line SL are then formed by a well-known photo photolithography-etching process (photo process 5) (FIG. 21F). The source/drain electrode SDM and the signal line SL have a laminated structure and a barrier layer comprising tungsten is present at the lower film in order to decrease contact resistance of the source/drain electrode SDM and the highly-doped polycrystalline silicon layer. The barrier film thickness is preferably 50 to 150 nm and the aluminum film thickness is preferably 400 to 600 nm.

With Embodiment 7, because the gate bottom electrode GMB is present above the lightly-doped n-type polycrystalline silicon layer LDN and the lightly-doped p-type polycrystalline silicon layer LDP, reliability of TFT with respect to electric stress can be increased.

Embodiment 8

Figure 4:
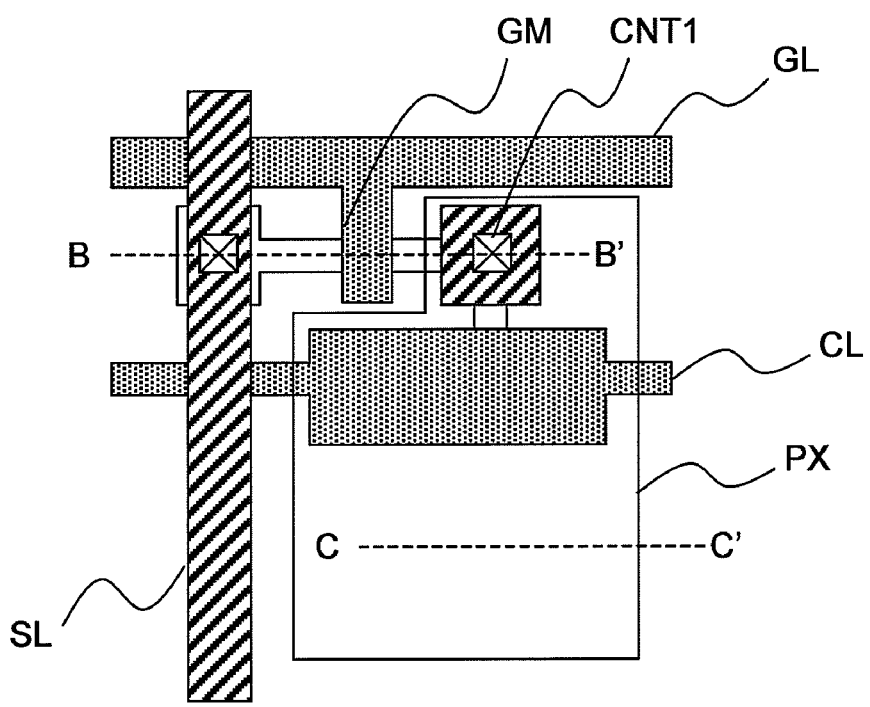
FIG. 4 is an explanatory drawing of a planar layout of pixels in the conventional display device.
Figure 5A:
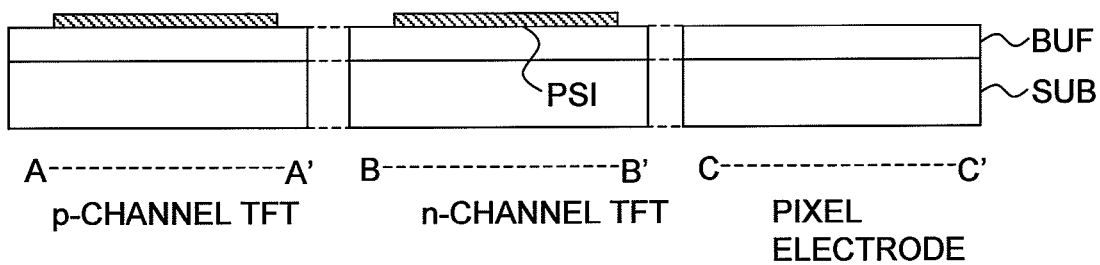
FIG. 5A is a cross-sectional view illustrating a process for manufacturing the conventional image display device.
Figure 5B:
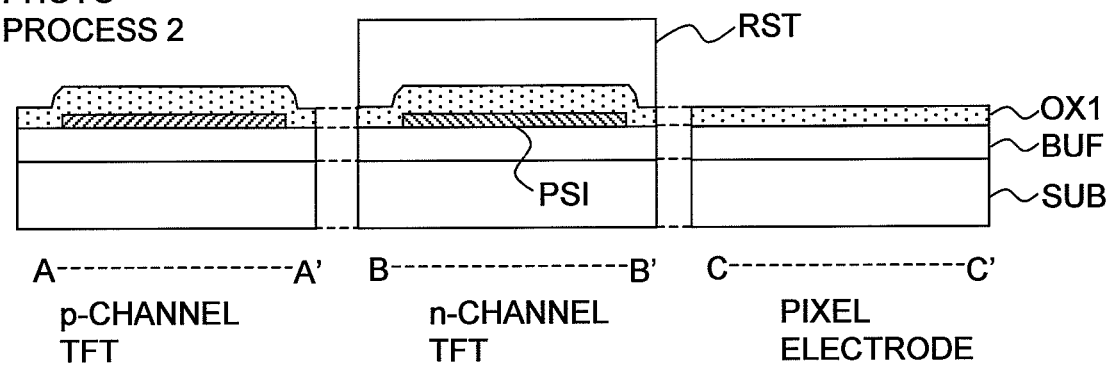
FIG. 5B is a cross-sectional view that is a continuation of the view shown in FIG. 5A and illustrates a process for manufacturing the conventional image display device.
Figure 5C:
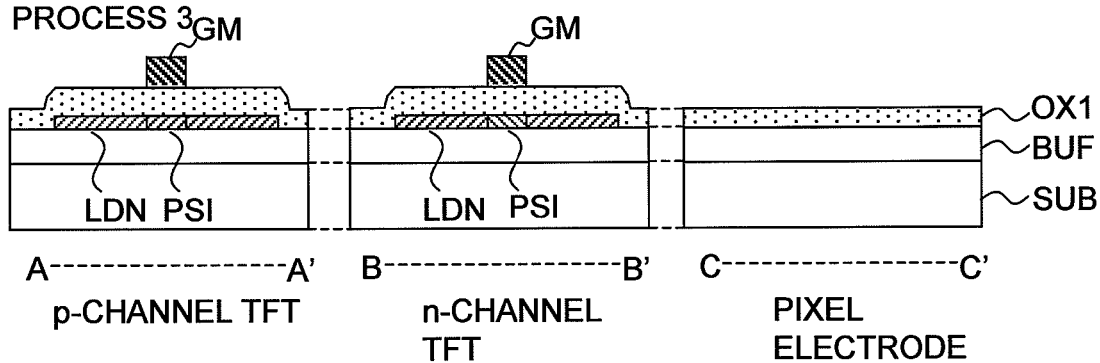
FIG. 5C is a cross-sectional view that is a continuation of the view shown in FIG. 5B and illustrates a process for manufacturing the conventional image display device.
Figure 5D:
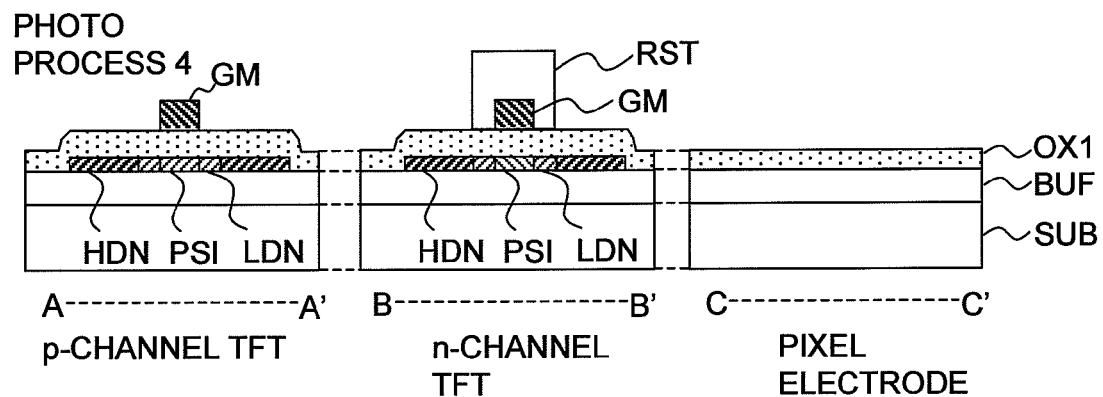
FIG. 5D is a cross-sectional view that is a continuation of the view shown in FIG. 5C and illustrates a process for manufacturing the conventional image display device.
Figure 5E:
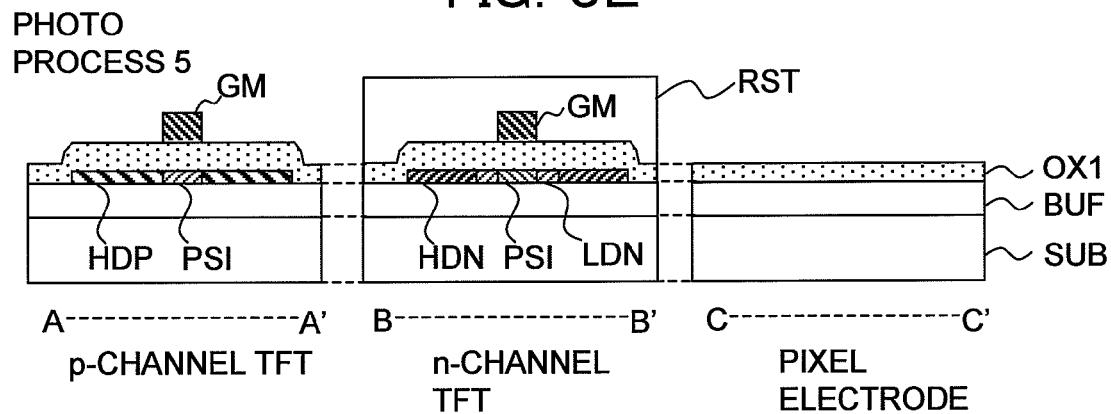
FIG. 5E is a cross-sectional view that is a continuation of the view shown in FIG. 5D and illustrates a process for manufacturing the conventional image display device.
Figure 5F:
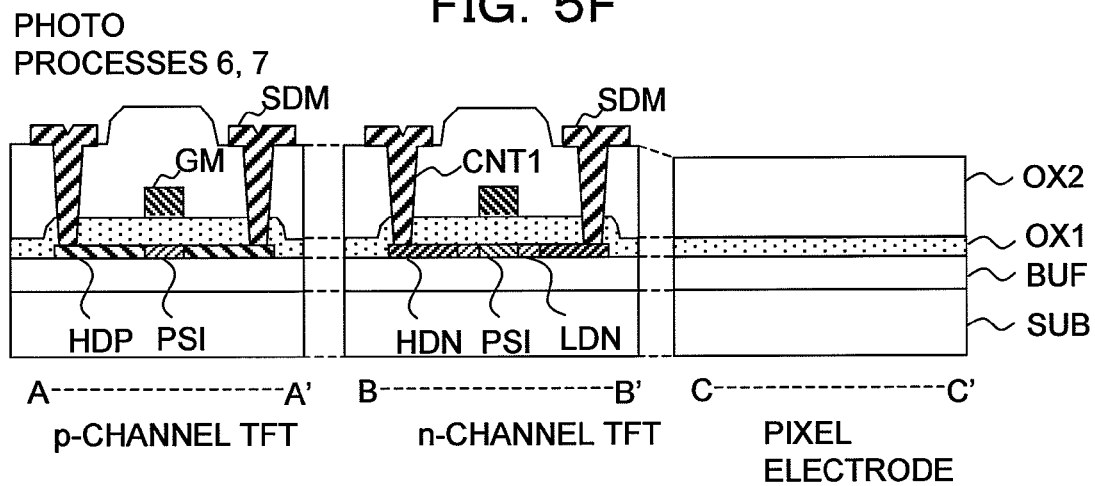
FIG. 5F is a cross-sectional view that is a continuation of the view shown in FIG. 5E and illustrates a process for manufacturing the conventional image display device.
Figure 5G:
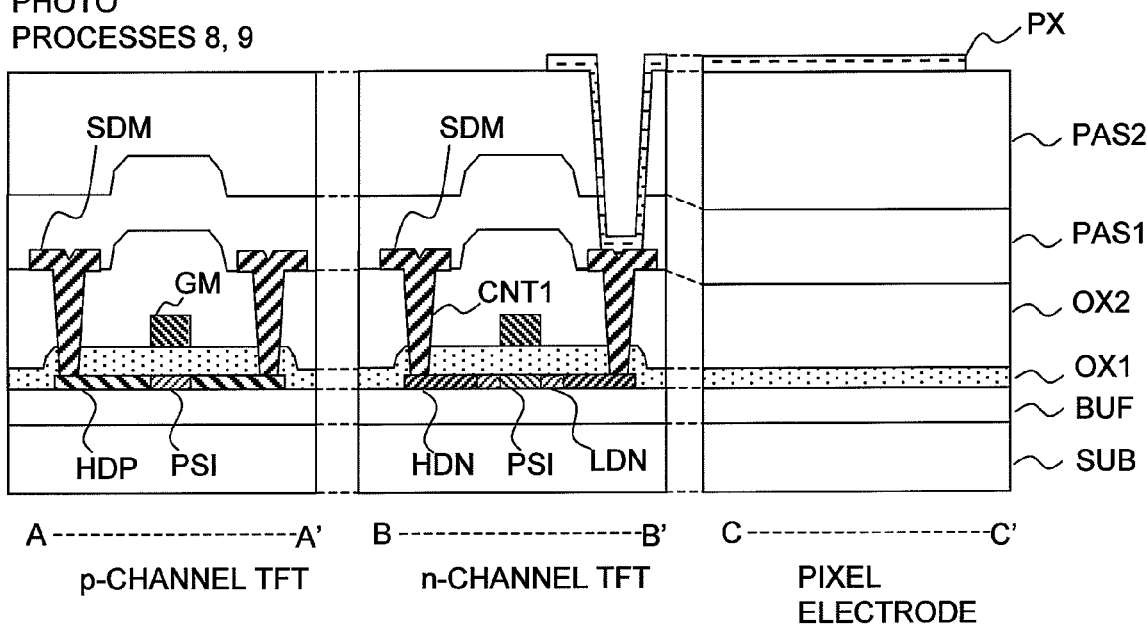
FIG. 5G is a cross-sectional view that is a continuation of the view shown in FIG. 5F and illustrates a process for manufacturing the conventional image display device.

The circuit configuration of the image display device of Embodiment 8 is identical to that shown in FIG. 2. The plane configuration of a CMOS 2 constituting a peripheral driver circuit and a plane configuration of a pixel 3 are identical to those shown in FIG. 6 and FIG. 4, respectively. A method for manufacturing the image display device of Embodiment 8 will be explained below with reference to FIGS. 22A to 22E by using a cross-sectional view along D-D' in FIG. 6 and cross-sectional views along B-B' and C-C' in FIG. 4.

Figure 22A:
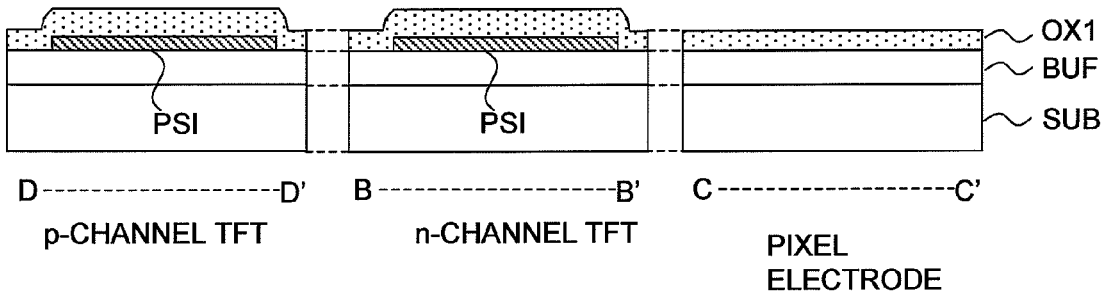
FIG. 22A is a cross-sectional view illustrating a process for manufacturing the image display device of Embodiment 8 of the present invention.

FIGS. 22A to 22E are cross-sectional views illustrating a process for manufacturing the image display device of Embodiment 8 of the present invention. A silicon oxide film BUF is deposited to a thickness of 100 nm as a buffer layer on a glass substrate SUB, and then an amorphous silicon layer is deposited to a thickness of 50 nm by plasma enhanced chemical vapor deposition. The amorphous silicon layer is then crystallized by irradiation with a XeCl excimer laser beam, and an island-like polycrystalline silicon layer PSI is obtained by a well-known photo photolithography-etching process (photo process 1). A gate insulating film OX1 is then deposited to a thickness of 100 nm by plasma enhanced chemical vapor deposition and boron ions are implanted to adjust the threshold value of the n-channel TFT (FIG. 22A).

Figure 22B:
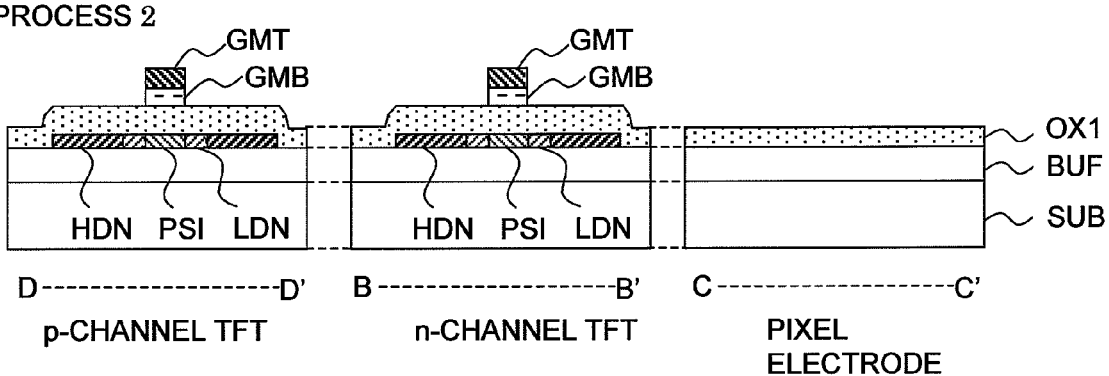
FIG. 22B is a cross-sectional view that is a continuation of the view shown in FIG. 22A and illustrates a process for manufacturing the image display device of Embodiment 8 of the present invention.

A laminated metal film comprising titanium with a film thickness of 30 nm and tungsten with a film thickness of 150 nm is then deposited and a gate electrode GM and a gate line GL by a well-known photolithography process (photo process 2). At this time, side etching of the gate electrode is performed and the electrode is reduced in size by 0.5 to 1.0 µm with respect to the resist. A highly-doped n-type polycrystalline silicon layer HDN is then formed by ion implantation of phosphorus performed by using the resist as a mask. The resist is then removed, ITO is removed by using the gate top electrode GTM as a mask, and a lightly-doped n-type polycrystalline silicon layer LDN is thereafter formed by ion implantation of phosphorus (FIG. 22B).

Figure 22C:
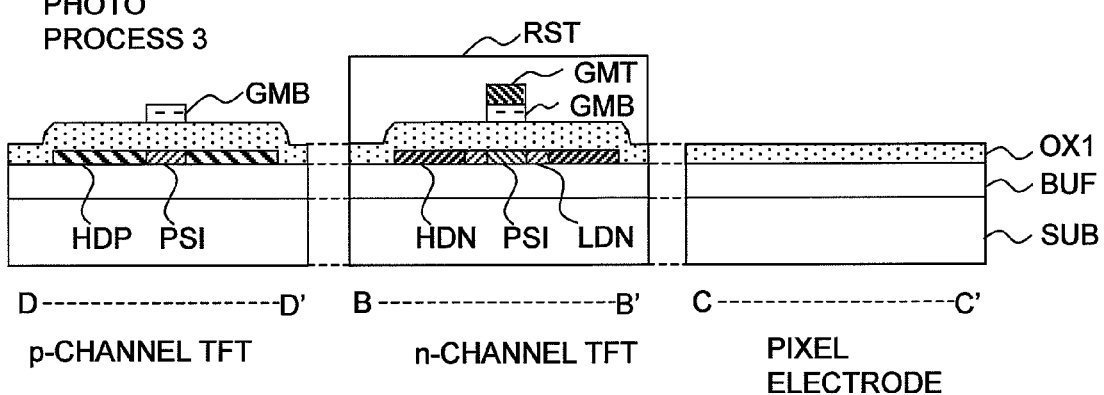
FIG. 22C is a cross-sectional view that is a continuation of the view shown in FIG. 22B and illustrates a process for manufacturing the image display device of Embodiment 8 of the present invention.

A region of the n-channel TFT is then covered with a resist by a well-known photolithography process (photo process 3), and a highly-doped p-type polycrystalline silicon layer HDP is formed by using the resist as a mask. Then, only the gate top electrode GMT is removed, and phosphorus ions are implanted to adjust the threshold value of the p-channel TFT (FIG. 22C). At this time because the gate bottom electrode GMB is as thin as 30 nm, phosphorus ions are implanted into the polycrystalline silicon layer PSI located below the gate bottom electrode. Furthermore, at this time, phosphorus ions are also implanted into the highly-doped p-type polycrystalline silicon layer HDP, but because the concentration of the implanted phosphorus ions is sufficiently lower than the concentration of boron in the highly-doped p-type polycrystalline silicon layer, the resistance of the highly-doped p-type polycrystalline silicon layer HDP practically does not change.

Figure 22D:
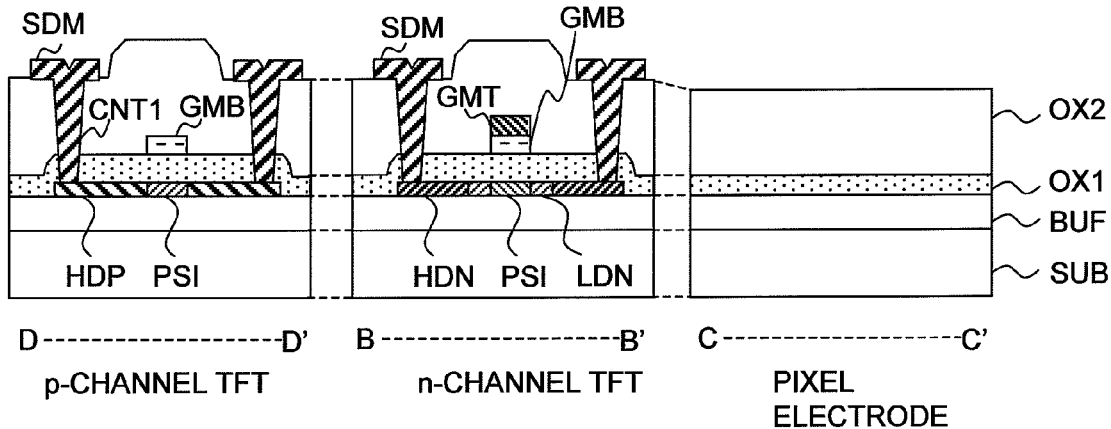
FIG. 22D is a cross-sectional view that is a continuation of the view shown in FIG. 22C and illustrates a process for manufacturing the image display device of Embodiment 8 of the present invention.

An interlayer insulating film OX2 is then formed by plasma enhanced chemical vapor deposition so as to cover the entire surface, and a contact hole CNT1 is formed by a well-known photo photolithography-etching process (photo process 4). A metal layer comprising aluminum is then deposited and a source/drain electrode SDM and a signal line SL are formed by a well-known photo photolithography-etching process (photo process 5) (FIG. 22D).

Figure 22E:
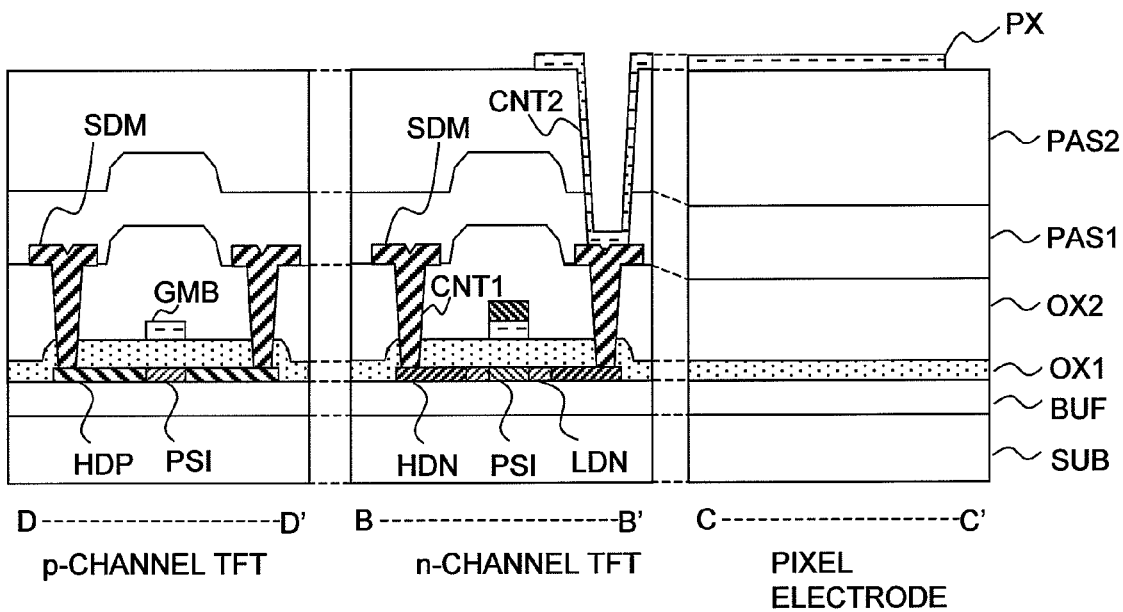
FIG. 22E is a cross-sectional view that is a continuation of the view shown in FIG. 22D and illustrates a process for manufacturing the image display device of Embodiment 8 of the present invention.

A passivation film PAS1 comprising silicon nitride and a passivation film PAS2 comprising an organic material are then formed so as to cover the entire surface, and a contact hole CNT2 is formed by a well-known photo photolithography-etching process (photo process 6). A pixel electrode PX comprising ITO is then formed by a well-known photo photolithography-etching process (photo process 7) (FIG. 22E). Barrier films comprising tungsten are present above and below the source/drain electrode SDM and the signal line SL in order to decrease contact resistance of the source/drain electrode, pixel electrode, and highly-doped polycrystalline silicon layer. The barrier film thickness is preferably 50 to 150 nm and the aluminum film thickness is preferably 400 to 600 nm.

With Embodiment 8, because the passivation film PAS2 is formed from an organic material, the specific permittivity is lower than that of the interlayer insulating film OX2, and film thickness can be increased. Therefore, parasitic capacity between the signal line SL and the pixel electrode can be decreased and a high-resolution liquid crystal display device can be provided.

In the image display devices of the above-described Embodiments 1 to 8, the insulating substrate is not limited to glass, and other insulating substrates such as quartz glass or plastic substrates may be used. Furthermore, a silicon nitride film (SiN) or a laminated film comprising a silicon oxide film and a silicon nitride film may be used instead of the silicon oxide (SiO) film as a buffer layer. If a silicon nitride film is used as a buffer layer, then impurities located in the glass substrate can be effectively prevented from diffusing and penetrating into the gate insulating film.

A solid-phase film growth method based on thermal annealing or a combination of thermal annealing and laser annealing may be used as a method for crystallizing the amorphous silicon. Furthermore, microcrystalline silicon, or a compound of silicon and germanium, or a well-known oxide semiconductor may be used as the semiconductor film.

Examples of materials suitable for the gate electrode and barrier metals of the source-drain electrode include metals such as Ti, TiW, TiN, W, Cr, Mo, Ta, Nb, V, Zr, Hf, Pt, and Ru, or alloys thereof. A well-known ZnO-based transparent electrode may serve as the pixel electrode ITO.

The cross-sectional structure in the intersection portions of the gate line GL and the signal line SL in the image display device explained in Embodiment 2 can be applied to other embodiments. Furthermore, the gate electrode GMB of the p-channel TFT in the display image devices described in Embodiments 1 to 7 is formed from a transparent electrode (ITO) and, therefore, transmits light. As a result, if a p-channel TFT is used as an optical sensor, the light detection efficiency is increased. Therefore, the present invention can be also applied to image display devices provided with a light detection function.

What is claimed is:

1. An image display device comprising a plurality of gate lines formed on an insulating substrate, a plurality of signal lines formed to cross said plurality of gate lines in a matrix fashion, and a plurality of thin-film transistors, wherein said plurality of gate lines have a laminated structure, said plurality of thin-film transistors include transistors of two types of an n-channel conductivity type and a p-channel conductivity type, gate electrodes of thin-film transistors of one type are laminated electrodes of the same configuration as said gate lines, and gate electrodes of thin-film transistors of the other type are electrodes of the same layer as bottom electrodes of said gate lines.

2. The image display device according to claim 1, wherein said gate lines and said signal lines have a laminated structure, and an upper film of said gate lines and a lower film of said signal lines are of the same material.

3. An image display device comprising a plurality of gate lines formed on an insulating substrate, a plurality of signal lines formed to cross said plurality of gate lines in a matrix fashion, and a plurality of thin-film transistors,
wherein said plurality of gate lines have a laminated structure, pixel electrodes are provided in a region surrounded by said plurality of gate lines and said plurality of signal lines, said plurality of thin-film transistors include transistors of two types of an n-channel conductivity type and a p-channel conductivity type, gate electrodes of thin-film transistors of one type are of the same material as said pixel electrodes, and gate electrodes of thin-film transistors of the other type have a laminated structure of a layer of the same material as said gate lines and a layer of the same material as said pixel electrodes.

4. The image display device according to claim 3, wherein gate electrodes of said thin-film transistors of the other type are laminated electrodes of the same configuration as said gate lines, and a lower film of said laminated electrodes and gate electrodes of said thin-film transistors of one type are electrodes of the same layer as said pixel electrodes.

5. The image display device according to claim 3, wherein said pixel electrodes and gate electrodes of said thin-film transistors of one type are transparent electrodes.

6. The image display device according to claim 3, wherein a film thickness of said pixel electrodes and gate electrodes of said thin-film transistors of one type is 20 nm or more to 60 nm or less.

7. The image display device according to claim 3, further comprising an interlayer insulating film between said gate lines and said signal lines, and electrodes of the same material as said pixel electrodes located via said interlayer insulating film above said pixel electrodes.

8. The image display device according to claim 3, wherein intersection portions of said gate lines and said signal lines have a configuration in which the lower film of the gate lines, the interlayer insulating film, and the signal lines are laminated in this order when viewed from the substrate.

9. The image display device according to claim 3, further comprising a passivation film that is in contact with an upper surface of said signal lines, and a light emitting layer formed to be in contact with an upper surface and a side surface of said passivation film and with an upper surface of said pixel electrodes.

10. The image display device according to claim 3, wherein said interlayer insulating film has contact holes, and the image display device has a light emitting layer formed to be in contact with an upper surface of said pixel electrodes and an upper surface and a side surface of said interlayer insulating film.

11. The image display device according to claim 3, wherein said signal lines have a laminated structure, and an oxide film serving as an upper film of said signal lines is formed on a surface of said signal lines.

12. The image display device according to claim 3, wherein gate electrodes of said plurality of thin-film transistors and said gate lines are laminated electrodes having as a lower layer of the same material as said pixel electrodes, and top electrodes of said laminated electrodes are subjected to size reduction processing with respect to the bottom electrodes of the same material as said pixel electrodes.

* * * * *